United States Patent
Jung et al.

(10) Patent No.: US 10,615,212 B2
(45) Date of Patent: Apr. 7, 2020

(54) FAN-OUT SENSOR PACKAGE

(71) Applicant: SAMSUNG ELECTRO-MECHANISM CO., LTD., Suwon-Si, Gyeonggi-Do (KR)

(72) Inventors: Ha Yong Jung, Suwon-Si (KR); Jae Kul Lee, Suson-Si (KR); Sung Taek Woo, Suwon-Si (KR); Ji Hye Shim, Suwon-Si (KR); Dong Jin Kim, Suwon-Si (KR); Han Sang Cho, Suwon-Si (KR); Woon Ha Choi, Suwon-Si (KR); Jae Min Choi, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/982,676

(22) Filed: May 17, 2018

(65) Prior Publication Data

US 2019/0189667 A1 Jun. 20, 2019

(30) Foreign Application Priority Data

Dec. 15, 2017 (KR) ........................ 10-2017-0173581

(51) Int. Cl.
*H01L 23/00* (2006.01)
*H01L 23/433* (2006.01)
(Continued)

(52) U.S. Cl.
CPC ........ *H01L 27/14636* (2013.01); *H01L 24/19* (2013.01); *H01L 24/20* (2013.01);
(Continued)

(58) Field of Classification Search
CPC ......... H01L 27/14636; H01L 27/14618; H01L 27/14685; H01L 27/14623;
(Continued)

(56) References Cited

U.S. PATENT DOCUMENTS 7,525,139 B2  4/2009  Yang et al.
9,601,463 B2 *  3/2017  Yu ....................... H01L 25/0657
(Continued)

FOREIGN PATENT DOCUMENTS

KR  10-2010-0041430 A  4/2010
KR  10-2017-0093277 A  8/2017
WO  2014083750 A1  6/2014

OTHER PUBLICATIONS

Office Action issued in corresponding Taiwanese Application No. 107117459, dated Feb. 21, 2019.
Notice of Office Action issued in Korean Patent Application No. 10-2017-0173581, dated Sep. 3, 2018 (English translation).

*Primary Examiner* — Mohsen Ahmadi
(74) *Attorney, Agent, or Firm* — Morgan, Lewis & Bockius LLP

(57) ABSTRACT

A fan-out sensor package includes: a sensor chip having a first connection pads and an optical layer; an encapsulant encapsulating at least portions of the sensor chip; a connection member disposed on the sensor chip and the encapsulant and including a redistribution layer electrically connected to the first connection pads; through-wirings penetrating through the encapsulant and electrically connected to the redistribution layer; and electrical connection structures disposed on the other surface of the encapsulant opposing one surface of the encapsulant on which the connection member is disposed and electrically connected to the through-wirings, wherein the sensor chip and the connection member are physically spaced apart from each other by a predetermined distance, and the first connection pads and the redistribution layer are electrically connected to each other through first connectors disposed between the sensor chip and the connection member.

21 Claims, 20 Drawing Sheets

(51) Int. Cl.
*H01L 23/538* (2006.01)
*H01L 23/31* (2006.01)
*H01L 27/146* (2006.01)
*H01L 23/48* (2006.01)

(52) U.S. Cl.
CPC .. *H01L 27/14618* (2013.01); *H01L 27/14634* (2013.01); *H01L 23/3107* (2013.01); *H01L 23/4334* (2013.01); *H01L 23/481* (2013.01); *H01L 23/5384* (2013.01); *H01L 24/33* (2013.01); *H01L 24/83* (2013.01); *H01L 27/1469* (2013.01); *H01L 27/14623* (2013.01); *H01L 27/14627* (2013.01); *H01L 27/14685* (2013.01); *H01L 2224/214* (2013.01)

(58) Field of Classification Search
CPC .......... H01L 27/14627; H01L 27/1469; H01L 2224/214; H01L 23/3114; H01L 23/481; H01L 23/5226; H01L 23/5389; H01L 24/26; H01L 23/3107; H01L 23/4334; H01L 23/5384; H01L 24/33; H01L 24/83
See application file for complete search history.

(56) References Cited

U.S. PATENT DOCUMENTS

| | | |
|---|---|---|
| 2004/0056365 A1 | 3/2004 | Kinsman |
| 2008/0083980 A1 | 4/2008 | Yang et al. |
| 2010/0090326 A1 | 4/2010 | Baek et al. |
| 2013/0149805 A1* | 6/2013 | Chuang ............... H01L 31/18 438/65 |
| 2015/0255500 A1 | 9/2015 | Akahoshi et al. |
| 2015/0303174 A1* | 10/2015 | Yu ................ H01L 21/565 257/712 |
| 2016/0322330 A1* | 11/2016 | Lin ................ H01L 25/0652 |
| 2017/0092689 A1 | 3/2017 | Deng et al. |
| 2018/0090530 A1* | 3/2018 | Jeong ............... H01L 27/14618 |
| 2019/0140011 A1* | 5/2019 | Kim ................ H01L 23/481 |
| 2019/0148254 A1* | 5/2019 | Na ................ H01L 23/3114 257/774 |
| 2019/0216325 A1* | 7/2019 | Ouyang ............ A61B 1/00009 |
| 2019/0333869 A1* | 10/2019 | Teng ................ H01L 25/50 |

* cited by examiner

I-I'

II-II'

FAN-OUT SENSOR PACKAGE

CROSS-REFERENCE TO RELATED APPLICATION(S)

This application claims the benefit of priority to Korean Patent Application No. 10-2017-0173581 filed on Dec. 15, 2017, in the Korean Intellectual Property Office, the disclosure of which is incorporated herein by reference in its entirety.

TECHNICAL FIELD

The present disclosure relates to a fan-out sensor package used in a camera module.

BACKGROUND

In packaging technology of devices used in mobile products such as a smartphone or a tablet personal computer (PC), miniaturization and improvements in the performance of packages have been continuously demanded. That is, efforts to manufacture the packages at a small size and add more functions in the same space have been conducted. Particularly, demand for miniaturization of components having additional functions rather than a main component has increased. For example, demand for miniaturization and performance improvements of an image sensor package used in a camera module, or the like, has increased.

SUMMARY

An aspect of the present disclosure may provide a fan-out sensor package of which miniaturization, performance improvement, simplification of processes, and reliability improvement are possible.

According to an aspect of the present disclosure, a fan-out sensor package may be provided, in which a connection member including a redistribution layer is formed on an optical member, a sensor chip is surface-mounted on the connection member using a separate connector, the sensor chip is encapsulated with an encapsulant, and through-wirings penetrating through the encapsulant are formed and are electrically connected to electrical connection structures formed beneath the encapsulant. In this case, a structure closing a light receiving unit of the sensor chip may be implemented using the optical member as a cover layer without separating the optical member. In addition, it may be considered that a memory chip is disposed side-by-side with the sensor chip by applying the content described above, and the sensor chip and the memory chip are encapsulated with the encapsulant and are electrically connected to each other through the redistribution layer of the connection member.

According to an aspect of the present disclosure, a fan-out sensor package may include: a sensor chip having a first surface having first connection pads and an optical layer disposed thereon and a second surface opposing the first surface; an encapsulant encapsulating at least portions of the sensor chip; a connection member disposed on the first surface of the sensor chip and the encapsulant and including a redistribution layer electrically connected to the first connection pads; through-wirings penetrating through the encapsulant and electrically connected to the redistribution layer; and electrical connection structures disposed on the other surface of the encapsulant opposing one surface of the encapsulant on which the connection member is disposed and electrically connected to the through-wirings, wherein the sensor chip and the connection member are physically spaced apart from each other by a predetermined distance, and the first connection pads and the redistribution layer are electrically connected to each other through first connectors disposed between the sensor chip and the connection member. In this case, the first connector may include a low melting point metal having a melting point lower than that of each metal included in the first connection pad and the redistribution layer, and the low melting point metal may include tin (Sn). Meanwhile, an optical member such as a glass carrier may be disposed on the other surface of the connection member opposing one surface of the connection member on which the encapsulant and the sensor chip are disposed. In addition, a memory chip having a first surface having second connection pads disposed thereon and a second surface opposing the first surface may be disposed side-by-side with the sensor chip, at least portions of the memory chip may be encapsulated with the encapsulant, and the second connection pads and the redistribution layer may be electrically connected to each other through second connectors disposed between the memory chip and the connection member, such that the first and second connection pads may be electrically connected to each other through the redistribution layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out sensor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure.

In this case, singular forms include plural forms unless interpreted otherwise in context.

Electronic Device

Figure 1:
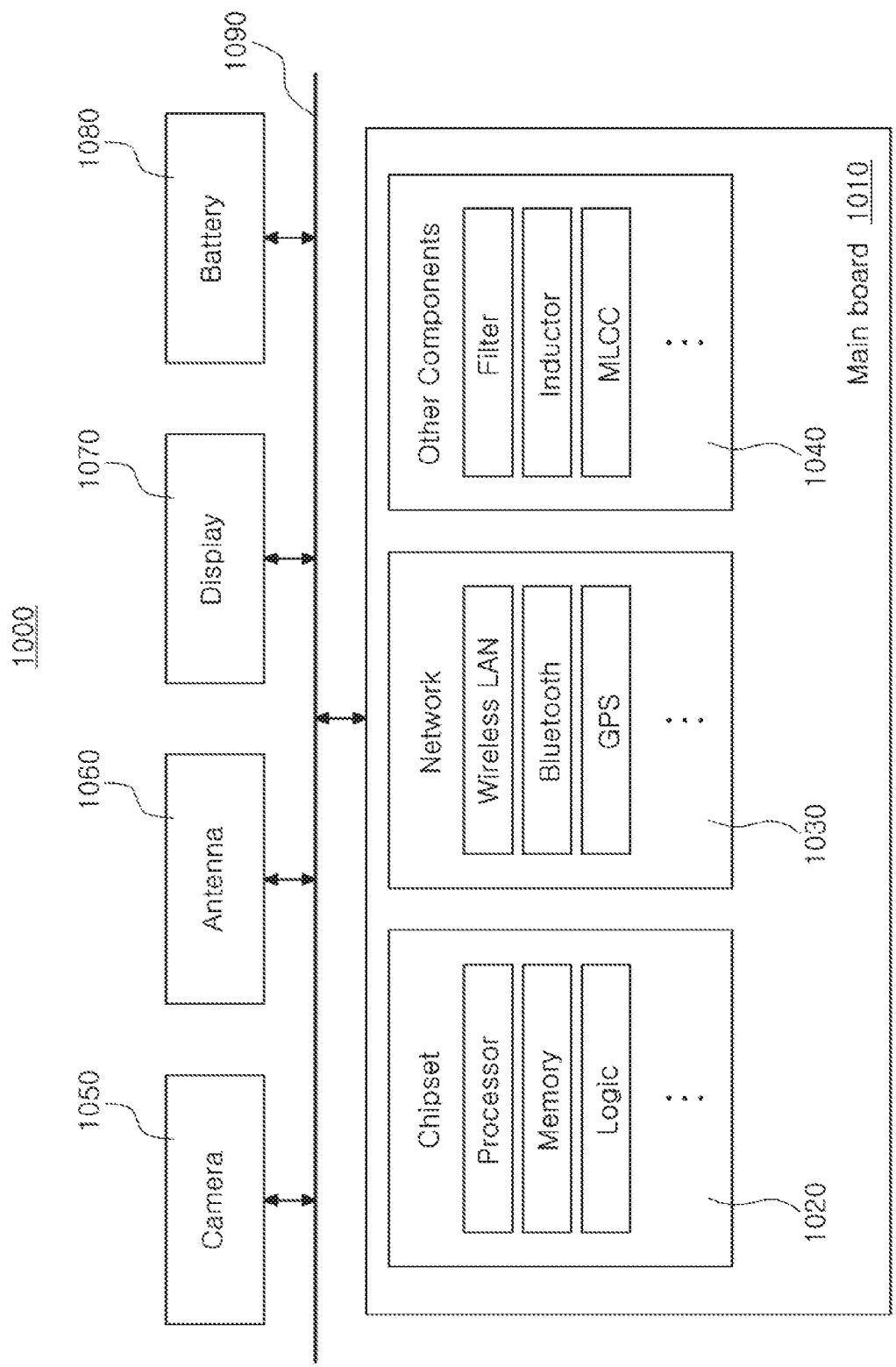
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
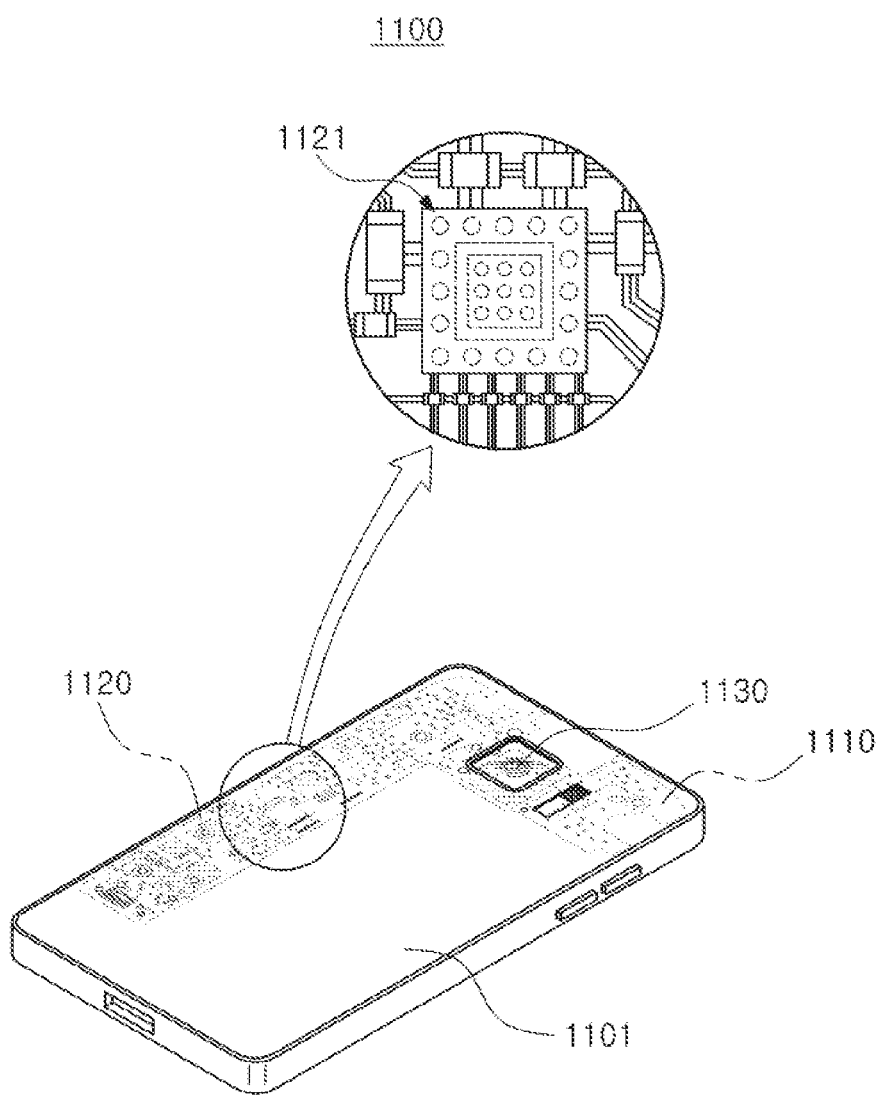
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in a body 1101 of the smartphone 1100, and various electronic components 1120 such as a semiconductor package 1121 may be physically or electrically connected to the mainboard 1110. In addition, other components that may or may not be physically or electrically connected to the mainboard 1110, such as the camera module 1130, may be accommodated in the body 1101. The camera module 1130 may include an image sensor package, and a fan-out sensor package according to the present disclosure may be used in the smartphone. Meanwhile, the electronic device in which the fan-out sensor package according to the present disclosure is used is not limited to the smartphone 1100. That is, the fan-out sensor package according to the present disclosure may also be used in other electronic devices.

Semiconductor Package

A fan-out sensor package according to the present disclosure may be manufactured using technology of a semiconductor package. Generally, numerous fine electrical circuits are integrated in a semiconductor. However, the semiconductor may not serve as a finished semiconductor product in itself, and may be damaged due to external physical or chemical impacts. Therefore, the semiconductor itself may not be used, but may be packaged and used in an electronic device, or the like, in a packaged state.

Here, semiconductor packaging is required due to the existence of a difference in a circuit width between the semiconductor and a mainboard of the electronic device in terms of electrical connections. In detail, a size of connection pads of the semiconductor and an interval between the connection pads of the semiconductor are very fine, but a size of component mounting pads of the mainboard and an interval between the component mounting pads of the mainboard are significantly larger than those of the semiconductor. Therefore, it may be difficult to directly mount the semiconductor on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
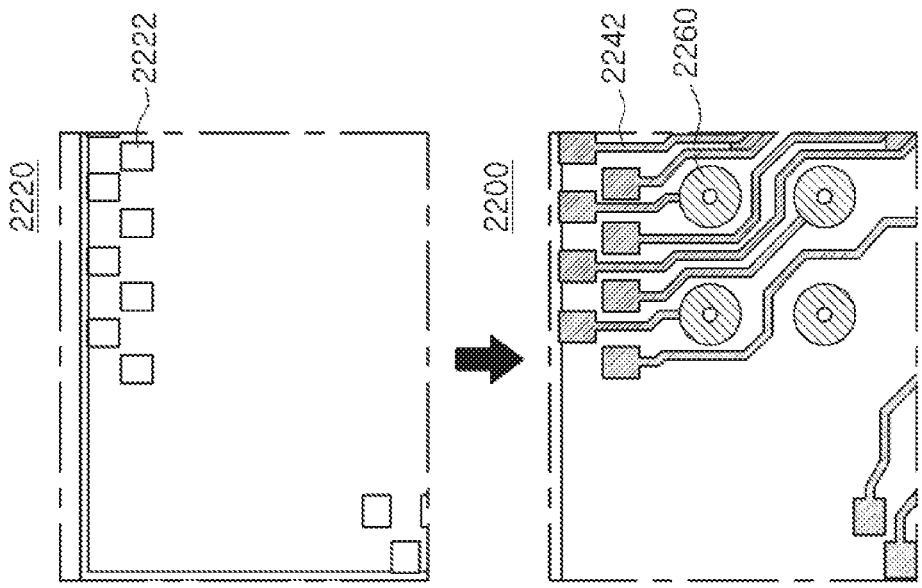
FIGS. 3A and 3B are schematic cross-sectional views illustrating states of a fan-in semiconductor package before and after being packaged.
Figure 3A:
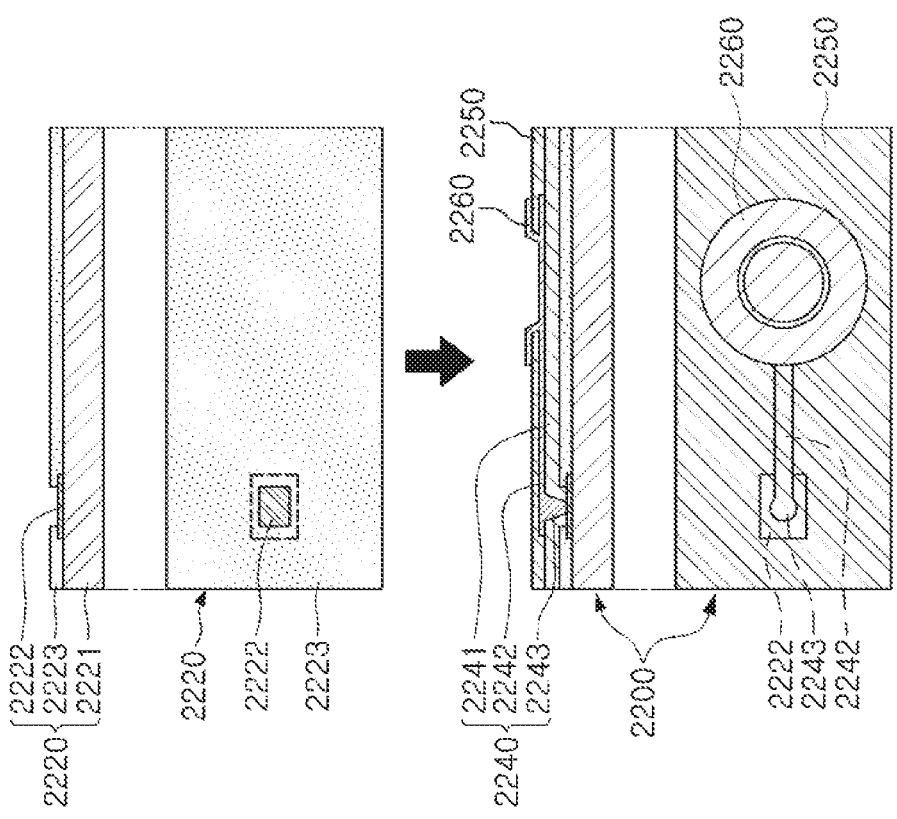

FIGS. 3A and 3B are schematic cross-sectional views illustrating states of a fan-in semiconductor package before and after being packaged.

Figure 4:
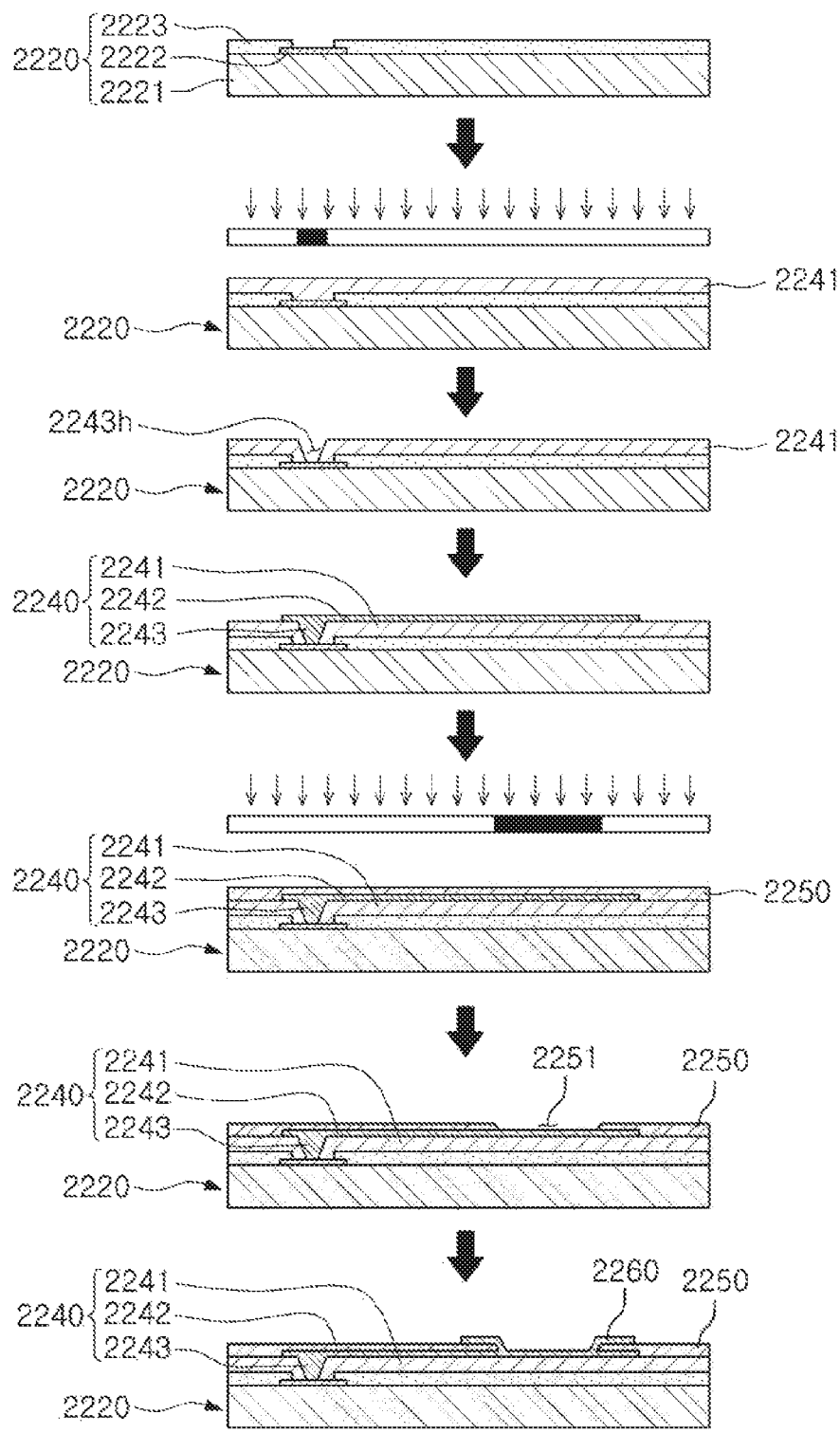
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor are disposed inside the semiconductor, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor in the fan-in semiconductor package, the fan-in semiconductor package has significant spatial limitations. Therefore, it is difficult to apply this structure to a semiconductor having a large number of I/O terminals or a semiconductor having a compact size. In addition, due to the disadvantage described above, the fan-in semiconductor package may not be directly mounted and used on the mainboard of the electronic device. The reason is that even in the case in which a size of the I/O terminals of the semiconductor and an interval between the I/O terminals of the semiconductor are increased by a redistribution process, the size of the I/O terminals of the semiconductor and the interval between the I/O terminals of the semiconductor may not be sufficient to directly mount the fan-in semiconductor package on the mainboard of the electronic device.

Figure 5:
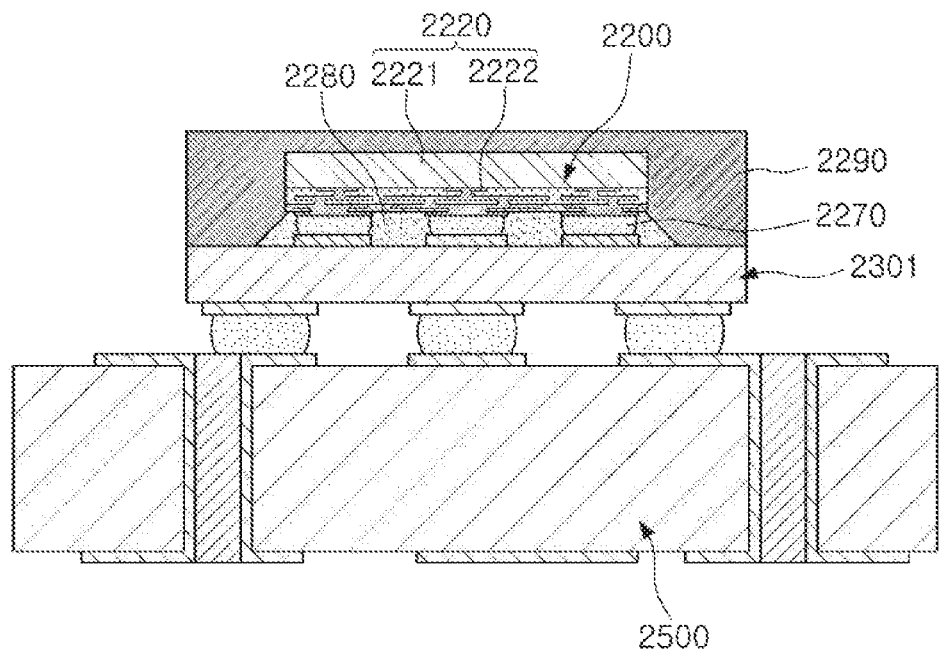
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
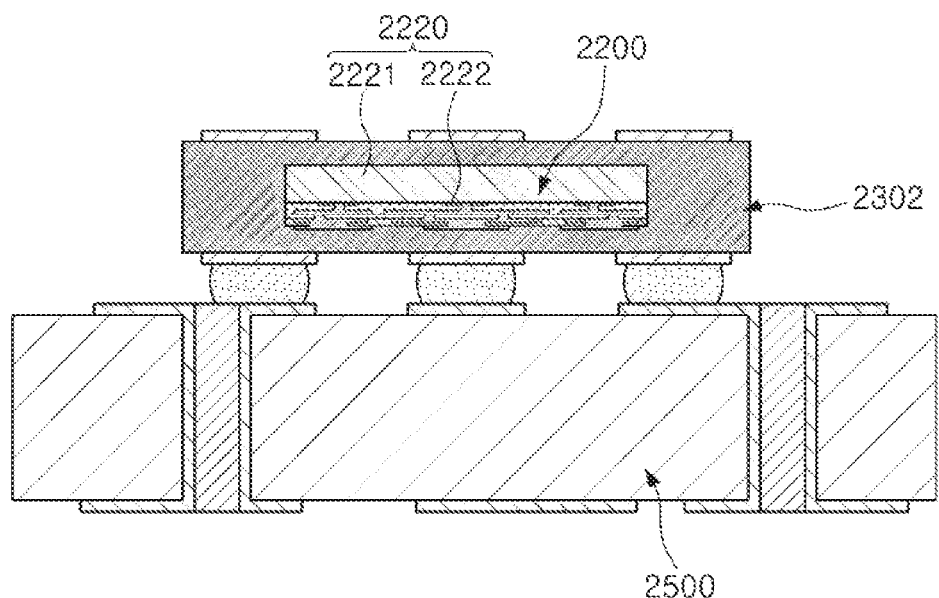
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
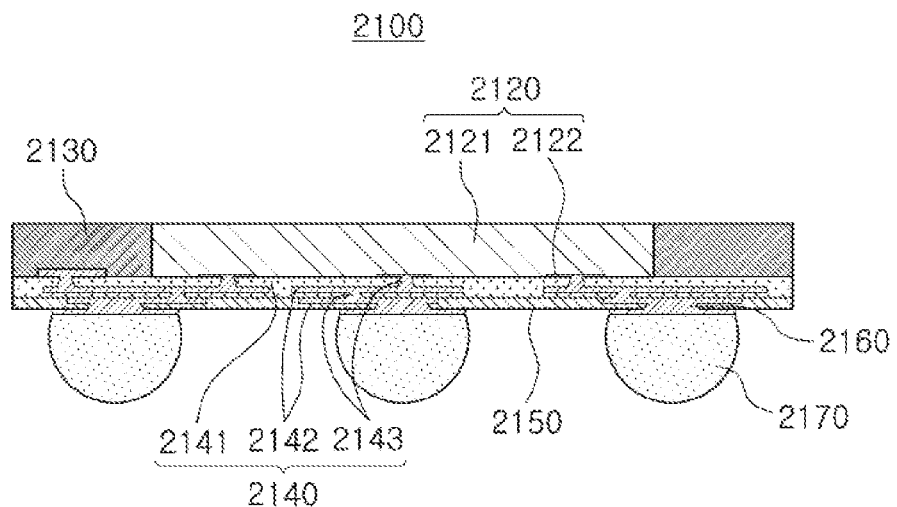
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor are redistributed and disposed outwardly of the semiconductor through the connection member formed on the semiconductor. As described above, in the fan-in semiconductor package, all I/O terminals of the semiconductor need to be disposed inside the semiconductor. Therefore, when a size of the semiconductor is decreased, a size and a pitch of balls need to be decreased, such that a standardized ball layout may not be used in the fan-in semiconductor package. On the other hand, the fan-out semiconductor package has the form in which the I/O terminals of the semiconductor are redistributed and disposed outwardly of the semiconductor through the connection member formed on the semiconductor as described above. Therefore, even in the case in which a size of the semiconductor is decreased, a standardized ball layout may be used in the fan-out semiconductor package as it is, such that the fan-out semiconductor package may be mounted on the mainboard of the electronic device without using a separate BGA substrate, as described below.

Figure 8:
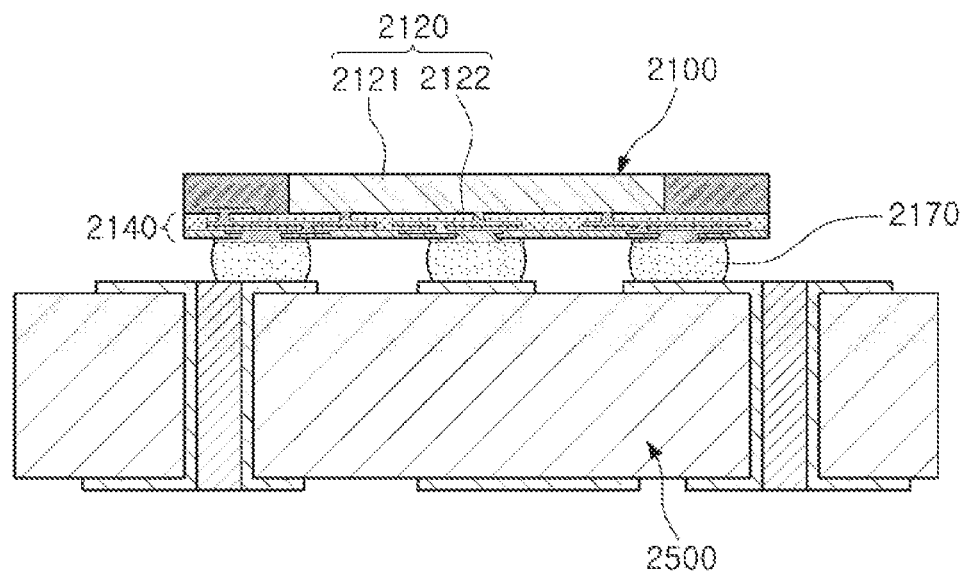
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor on the mainboard of the electronic device, or the like, as described above, and protecting the semiconductor from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out sensor package according to the present disclosure may be manufactured using the fan-out semiconductor package technology described above. A fan-out sensor package according to the present disclosure will hereinafter be described with reference to the drawings.

Figure 9:
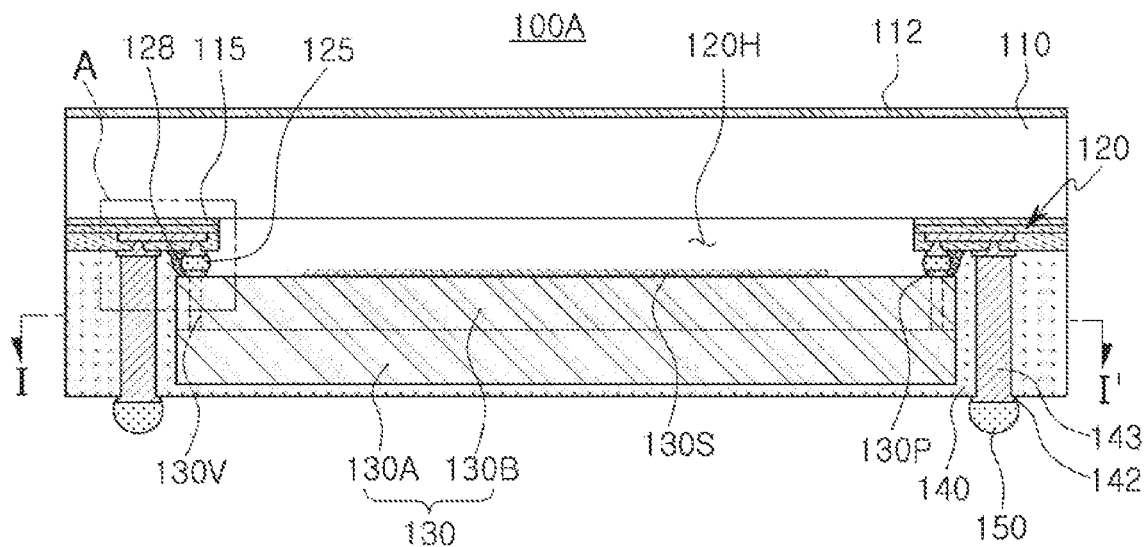
FIG. 9 is a schematic cross-sectional view illustrating an example of a fan-out sensor package.

FIG. 9 is a schematic cross-sectional view illustrating an example of a fan-out sensor package.

Figure 10:
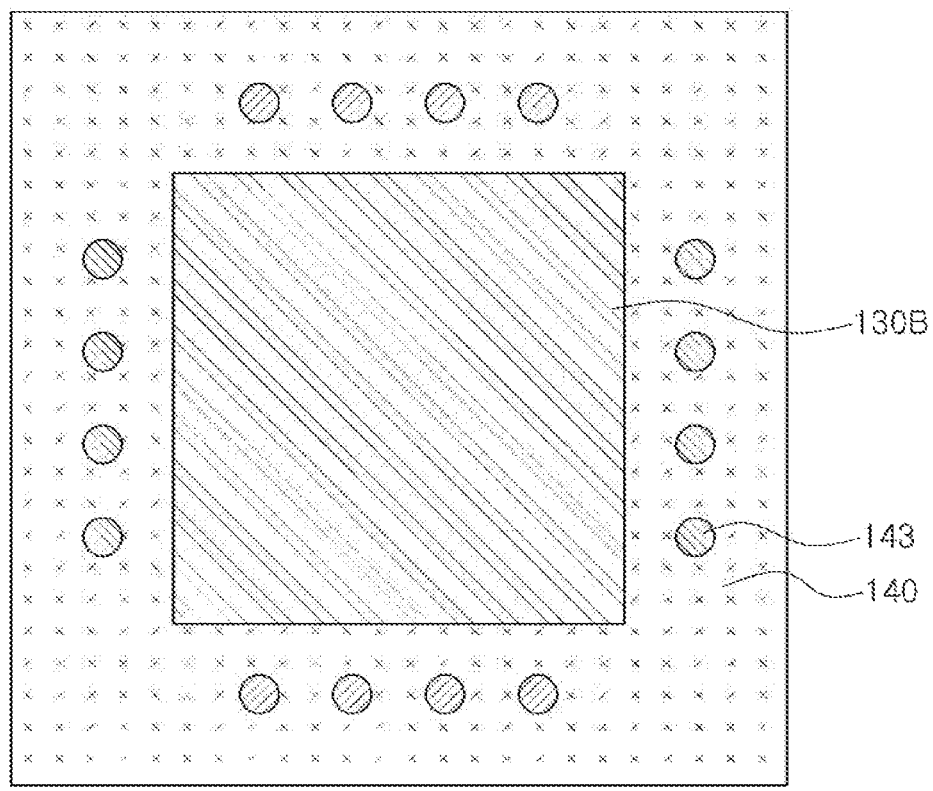
FIG. 10 is a schematic plan view taken along line I-I' of the fan-out sensor package of FIG. 9.

FIG. 10 is a schematic plan view taken along line I-I' of the fan-out sensor package of FIG. 9.

Figure 11:
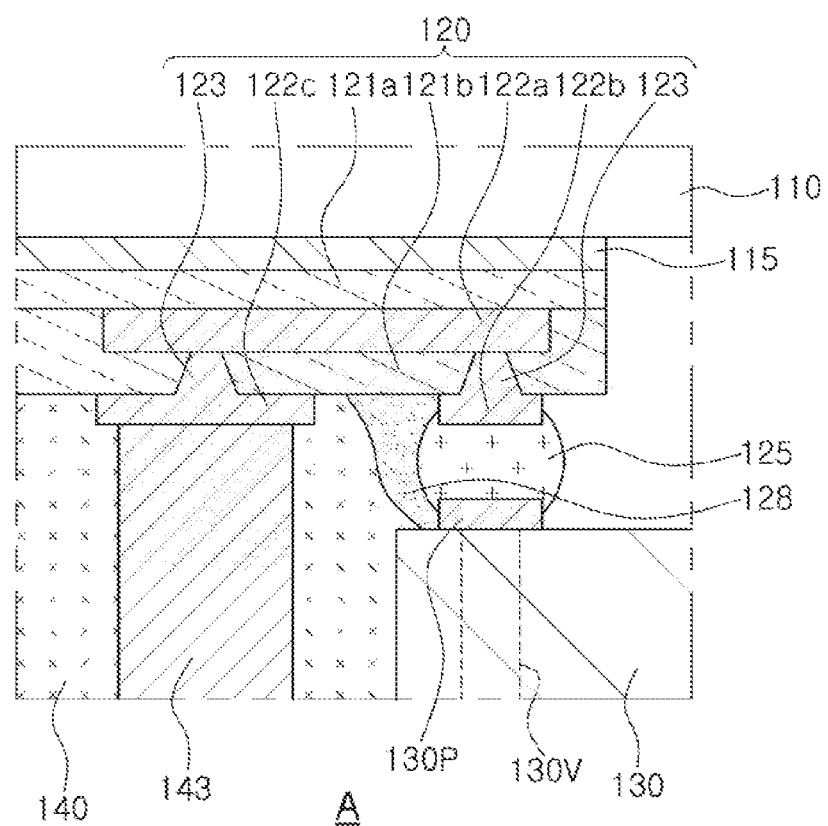
FIG. 11 is a schematic enlarged cross-sectional view illustrating region A of the fan-out sensor package of FIG. 9.

FIG. 11 is a schematic enlarged cross-sectional view illustrating region A of the fan-out sensor package of FIG. 9.

Referring to FIGS. 9 through 11, a fan-out sensor package 100A according to an exemplary embodiment in the present disclosure may include a sensor chip 130 having a first surface having connection pads 130P and an optical layer 130S disposed thereon and a second surface opposing the first surface, an encapsulant 140 encapsulating at least portions of the sensor chip 130, a connection member 120 disposed on the first surface of the sensor chip 130 and the encapsulant 140 and including redistribution layers 122a and 122b electrically connected to the connection pads 130P, through-wirings 143 penetrating through the encapsulant 140 and electrically connected to the redistribution layers 122a and 122b, electrical connection structures 150 disposed on the other surface of the encapsulant 140 opposing one surface of the encapsulant 140 on which the connection member 120 is disposed and electrically connected to the through-wirings 143, and an optical member 110 disposed on the other surface of the connection member 120 opposing one surface of the connection member 120 on which the encapsulant 140 and the sensor chip 130 are disposed. The sensor chip 130 and the connection member 120 may be physically spaced apart from each other by a predetermined distance, and the connection pads 130P and the redistribution layers 122a and 122b may be electrically connected to each other through connectors 125 disposed between the sensor chip 130 and the connection member 120.

Meanwhile, recently, in accordance with a demand of the market for thinness, multi-functionalization, and performance improvement of electronic devices, an effort to apply semiconductor package technology to various applications has been conducted. A typical example of these applications may include an electrical camera module. Reliability of the electrical camera module is most important in developing the electrical camera module. To this end, the electrical camera module generally uses a structure completely closing a light receiving unit of an image sensor. For example, the structure closing the light receiving unit of the image sensor may be implemented by attaching the image sensor to a printed circuit board (PCB) in a wiring bonding manner and then attaching a glass cover to an upper portion of the image sensor. In this structure, a manner of sealing the light receiving unit of the image sensor is used, and the reliability of the electrical camera module may thus be secured. However, when the electrical camera module uses the structure described above, it is difficult to decrease a thickness of the PCB, such that there is a limitation in thinness of the electrical camera module, and it is difficult to sufficiently utilize a space due to interconnection of the image sensor and the PCB in the wire bonding manner, such that there is a limitation in miniaturization and performance improvement of the electrical camera module. In addition, wiring bonding is forced, and a separate glass cover needs to be attached after a package is manufactured, and a process of implementing a module is thus complicated.

On the other hand, the fan-out sensor package 100A according to the exemplary embodiment may have a structure in which the connection member 120 including the redistribution layers 122a and 122b is formed on the optical member 110, the sensor chip 130 is surface-mounted on the connection member 120 using separate connectors 125, the sensor chip 130 is encapsulated with the encapsulant 140, and the through-wirings 143 penetrating through the encapsulant 140 are formed and are electrically connected to the electrical connection structures 150 disposed beneath the encapsulant 140. As described above, the connection pads 130P of the sensor chip 130 may be redistributed using the connection member 120 rather than wiring bonding. Therefore, the fan-out sensor package 100A may be miniaturized, performance of the fan-out sensor package 100A may be improved, and a module may be more easily manufactured. In addition, since the sensor chip 130 is surface-mounted on the connection member 120 manufactured in advance, using the connectors 125, reliability of the fan-out sensor package 100A may be excellent, and a phenomenon in which a yield of the sensor chip 130 is affected by a defect occurring before the sensor chip 130 is disposed may be prevented. In addition, since an electrical connection path between upper and lower portions is implemented using the through-wirings 143 penetrating through the encapsulant 140, the fan-out sensor package 100A may also be thinned. In addition, a structure closing a light receiving unit of the sensor chip 130 may be implemented using the optical member 110 as a cover layer without separating the optical member 110.

Therefore, the fan-out sensor package 100A may be easily used in the electrical camera module. When a glass carrier for forming the connection member 120 is used as the optical member 110, material and process costs may also be decreased.

The respective components included in the fan-out sensor package 100A according to the exemplary embodiment will hereinafter be described below in more detail.

The optical member 110 may implement the structure closing the light receiving unit of the sensor chip 130. The optical member may be separated from the fan-out sensor package 100A depending on an application in which the fan-out sensor package 100A is used. A material of the optical member 110 is not particularly as long as it may transmit light therethrough, but may be a glass carrier in terms of a process for allowing the optical member 110 to serve as a carrier for mass production of the fan-out sensor package 100A. Here, the glass carrier refers to a carrier formed of a transparent glass, and is different from a resin layer in which a glass fiber is included in an insulating resin. An infrared blocking coating layer 112 may be formed on a first surface of the optical member 110, and a barrier layer 115 may be formed on a second surface of the optical member 110. The barrier layer 115 may be formed on only an outer side portion of the second surface of the optical member 110 rather than on a central portion of the second surface of the optical member 110. That is, the barrier layer 115 may be disposed between the optical member 110 and the connection member 120. This may be to prevent the barrier layer 115 from blocking light transmission. A material of the infrared blocking coating layer 112 is not particularly limited as long as it may block an infrared (IR) ray. The barrier layer 115 may prevent light from being introduced into the connection member 120, and the like, and may include any known insulating material, but is not limited thereto. That is, the barrier layer 115 may also include another material as long as it may serve as a barrier.

The connection member 120 may redistribute the connection pads 130P of the sensor chip 130. In addition, the connection member 120 may connect the sensor chip 130 to other components. The connection member 120 may include a first insulating layer 121a disposed on the barrier layer 115, a first redistribution layer 122a disposed on the first insulating layer 121a, a second insulating layer 121b disposed on the first insulating layer 121a and covering the first redistribution layer 122a, a second redistribution layer 122b disposed on the second insulating layer 121b, and vias 123 penetrating through the first insulating layer 121a and electrically connecting the first and second redistribution layers 122a and 122b to each other. The connection member 120 may include larger numbers of insulating layers, redistribution layers, and vias, or may include smaller numbers of insulating layers, redistribution layers, and vias, if necessary. The connection member 120 may have an opening 120H exposing the optical layer 130S of the sensor chip 130. The optical layer 130S may not be covered with the encapsulant 140, and air may be disposed between the optical layer 130S and the optical member 110 through the opening 120H of the connection member 120.

The insulating layers 121a and 121b may provide insulating regions to the connection member 120. A material of each of the insulating layers 121a and 121b is not particularly limited. For example, an insulating material may be used as the material of each of the insulating layers 121a and 121b. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric). A photoimagable dielectric (PID) may be used as the material of each of the insulating layers 121a and 121b in order to achieve fine pitches of the redistribution layers 122a and 122b formed on the insulating layers 121a and 121b, respectively, and the vias 123 formed in the insulating layers 121a and 121b. The insulating layers 121a and 121b may include the same material, and a boundary between the insulating layers 121a and 121b may not be apparent depending on a hardening result.

The redistribution layers 122a and 122b may substantially redistribute the connection pads 130P. A material of each of the redistribution layers 122a and 122b may be a conductive material such as copper (Cu), aluminum (Al), silver (Ag), gold (Au), nickel (Ni), lead (Pb), titanium (Ti), or alloys thereof. The redistribution layers 122a and 122b may perform various functions depending on designs of corresponding layers. For example, the redistribution layers 122a and 122b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 122a and 122b may include via pads, connection terminal pads, and the like.

A surface treatment layer (not illustrated) may be formed on an exposed surface of the redistribution layer 122b, if necessary. The surface treatment layer may be formed by, for example, electrolytic gold plating, electroless gold plating, organic solderability preservative (OSP) or electroless tin plating, electroless silver plating, electroless nickel plating/ substituted gold plating, direct immersion gold (DIG) plating, hot air solder leveling (HASL), or the like, but is not limited thereto.

The vias 123 may electrically connect the redistribution layers 122a and 122b formed on different layers to each other, resulting in an electrical path in the connection member 120. A material of each of the vias 123 may be a conductive material such as copper (Cu), aluminum (Al), silver (Ag), gold (Au), nickel (Ni), lead (Pb), titanium (Ti), or alloys thereof. Each of the vias 123 may be completely filled with the conductive material, or the conductive material may also be formed along a wall of each of the vias. In addition, each of the vias 123 may have any shape known in the related art such as a tapered shape.

The sensor chip 130 may have the first surface having connection pads 130P and the optical layer 130S disposed thereon and the second surface opposing the first surface. A base material of a body of the sensor 130 may be silicon (Si), germanium (Ge), gallium arsenide (GaAs), or the like. Various circuits may be formed on the body. That is, the sensor chip 130 may be an IC type die manufactured by a wafer process. The connection pads 130P may electrically connect the sensor chip 130 to other components. A material of each of the connection pads 130P may be a conductive material such as aluminum (Al), copper (Cu), or the like. The optical layer 130S may be a lens layer, more specifically, a micro lens layer. The optical layer 130S may include a plurality of lens layers.

The sensor chip 130 may have a bonded structure between a logic die 130A and a sensor die 130B. The logic die 130A and the sensor die 130B may be IC type dies, and may be bonded to each other on a wafer and be sawed together. The logic die 130A and the sensor die 130B may be electrically connected to each other through through-silicon vias (TSVs) 130V penetrating through the sensor die 130B. Meanwhile, the sensor die 130B may be an image sensor, more specifically, a backside image sensor such as a complementary metal oxide semiconductor (CMOS) type image sensor, a charge coupled device (CCD) type image sensor, or the like, but is not limited thereto. Meanwhile, unlike illustrated in the drawing, the logic die 130A may have a thickness greater than that of the sensor die 130B.

The connectors 125 may be disposed between the sensor chip 130 and the connection member 120, and may electrically connect the connection pads 130P and the redistribution layers 122a and 122b to each other. The connector 125 may include a low melting point metal. The low melting point metal refers to a metal having a melting point lower than that of each metal included in the connection pads 130P and the redistribution layers 122a and 122b. The low melting point metal may be, for example, tin (Sn), but is not limited thereto. In more detail, the connector 125 may be a solder ball. In this case, the solder ball may be formed of an alloy including tin (Sn), such as tin (Sn)-copper (Cu), tin (Sn)-silver (Ag), tin (Sn)-silver (Ag)-copper (Cu), or the like, but is not limited thereto.

An underfill resin 128 may serve to fix the sensor chip 130 connected to the connector 125. The underfill resin 128 may also be omitted. The underfill resin 128 may include any known insulating resin having an adhesive property, such as epoxy. The underfill resin 128 may cover at least portions of the connector 125. In addition, the underfill resin 128 may cover portions of the connection member 120 and the sensor chip 130. An edge portion of the sensor chip 130 may be fixed by the underfill resin 128, such that reliability may be improved.

The encapsulant 140 may protect the sensor chip 130. The encapsulant 140 may encapsulate at least portions of the sensor chip 130. An encapsulation form of the encapsulant 140 is not particularly limited, but may be a form in which the encapsulant 140 covers at least portions of side surfaces of the sensor chip 130 between the first and second surfaces of the sensor chips 130 and at least portions of the second surface of the sensor chip 130. A material of the encapsulant 140 is not particularly limited. For example, the material of the encapsulant 140 may be prepreg including an insulating resin, a core material, a filler, and the like, or may be ABF including an insulating resin and a filler. If necessary, the material of the encapsulant 140 may be a photoimagable encapsulant (PIE) including a photosensitive insulating material. Light noise introduced from an external source may be blocked using optical characteristics of the material of the encapsulant 140.

The through-wirings 143 may penetrate through the encapsulant 140. The through-wirings 143 may be connected to the redistribution layer 122b of the connection member 120. The through-wirings 143 may be electrically connected to the connection pads 130P of the sensor chip 130 through the redistribution layers 122a and 122b of the connection member 120. The through-wirings 143 may include a conductive material such as copper (Cu), aluminum (Al), silver (Ag), gold (Au), nickel (Ni), lead (Pb), titanium (Ti), or alloys thereof. In addition, each of the through-wirings 143 may have any known shape such as a cylindrical shape, a hourglass shape, or the like. Pad layers 142 for the electrical connection structures may be disposed on the other surface of the encapsulant 140 opposing one surface of the encapsulant 140 on which the connection member 120 is disposed. The pad layers 142 may also include a conductive material such as copper (Cu), aluminum (Al), silver (Ag), gold (Au), nickel (Ni), lead (Pb), titanium (Ti), or alloys thereof.

The electrical connection structure 150 may be configured to physically or electrically externally connect the fan-out sensor package 100A. For example, the fan-out sensor package 100A may be mounted on the mainboard of the electronic device through electrical connection structures 150. Each of the electrical connection structures 150 may be formed of a low melting point metal, for example, a solder including tin (Sn). However, this is only an example, and a material of each of the electrical connection structures 150 is not particularly limited thereto. Each of the electrical connection structures 150 may be a land, a ball, a pin, or the like. The electrical connection structures 150 may be formed as a multilayer or single layer structure. When the electrical connection structures 150 are formed as a multilayer structure, the electrical connection structures 150 may include a copper (Cu) pillar and a solder. When the electrical connection structures 150 are formed as a single layer structure, the electrical connection structures 150 may include a tin-silver solder or copper (Cu). However, this is only an example, and the electrical connection structures 150 are not limited thereto.

The number, an interval, a disposition form, and the like, of electrical connection structures 150 are not particularly limited, but may be sufficiently modified depending on design particulars by those skilled in the art. For example, the electrical connection structures 150 may be provided in an amount of several tens to several millions according to the number of connection pads 130P, or may be provided in an amount of several tens to several millions or more or several tens to several millions or less. When the electrical connection structures 150 are solder balls, the electrical connection structures 150 may cover side surfaces of the pad layers 142, and connection reliability may be more excellent.

At least one of the electrical connection structures 150 may be disposed in a fan-out region. The fan-out region refers to a region except for a region in which the sensor chip 130 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

FIGS. 12A through 12D are schematic views illustrating an example of processes of manufacturing the fan-out sensor package of FIG. 9.

Figure 12A:
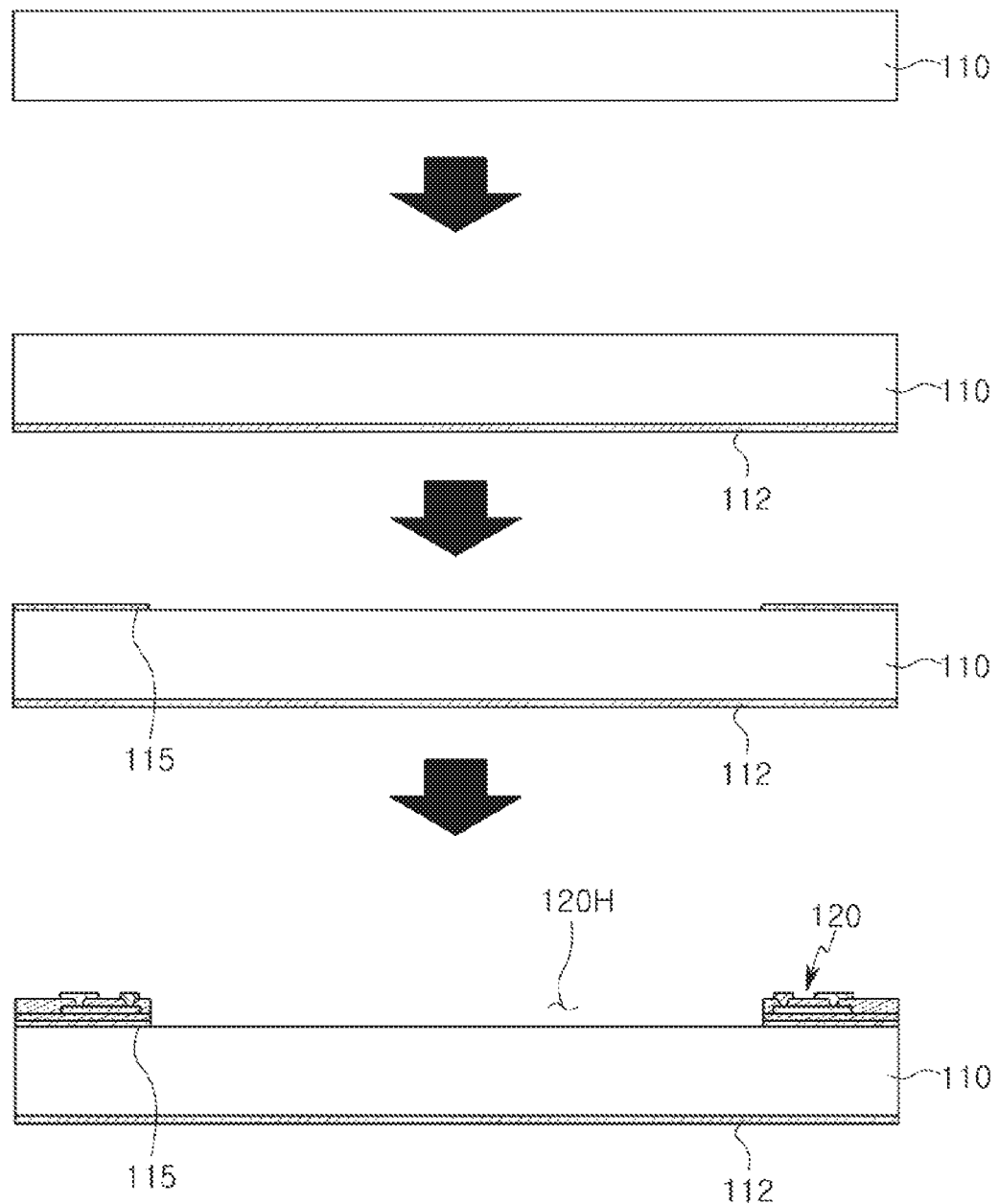
FIGS. 12A through 12D are schematic views illustrating an example of processes of manufacturing the fan-out sensor package of FIG. 9.

Referring to FIG. 12A, the optical member 110 may be first prepared. Since the optical member 110 is used as the carrier in a manufacturing process as described above, the glass carrier may be used as the optical member 110. The glass carrier may be formed of a transparent glass and may have a large area, and may be later divided into a plurality of portions by dicing. Then, optionally, the infrared blocking coating layer 112 and the barrier layer 115 may be formed on the first and second surfaces of the optical member 110, respectively. The infrared blocking coating layer 112 and the barrier layer 115 may be formed by any known coating method. Then, the connection member 120 may be formed on the barrier layer 115 of the optical member 110. The connection member 120 may be formed by forming the first insulating layer 121a by a lamination method or an applying method using a PID, or the like, forming the first redistribution layer 122a on the first insulating layer 121a by any known plating method, forming the second insulating layer 121b covering the first redistribution layer 122a on the first insulating layer 121a by a lamination method or an applying method, forming blind via holes in the second insulating layer 121b by a photolithography method, or the like, forming the second redistribution layer 122b and the vias 123 on the second insulating layer 121b and in the via holes, respectively, by any known plating process, and then forming the opening 120H by a photolithography method or using a laser drill, a mechanical drill, or the like.

Figure 12B:
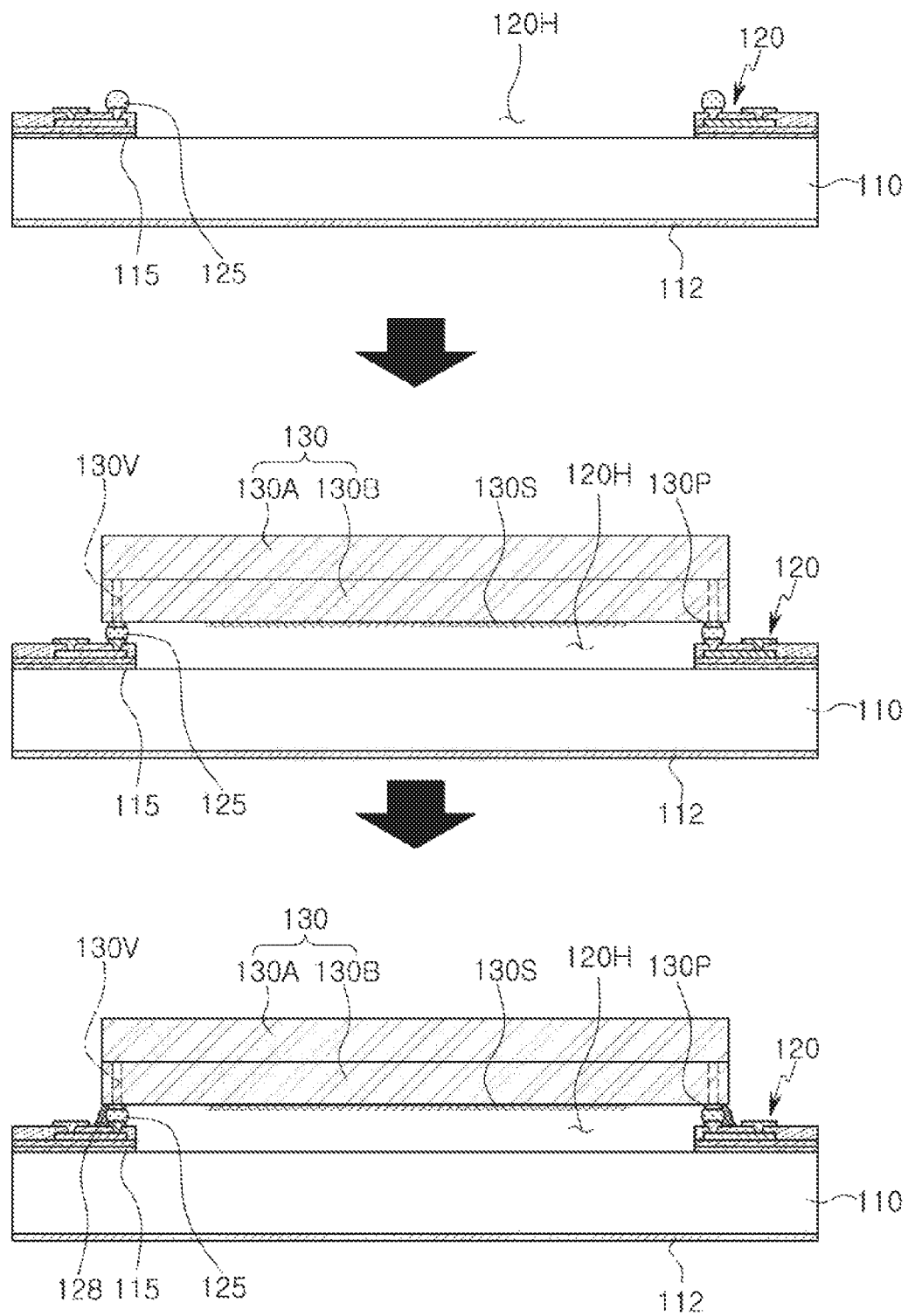

Then, referring to FIG. 12B, the connectors 125 may be formed on pad patterns of the second redistribution layer 122b of the connection member 120 using a solder material, or the like. Then, the sensor chip 130 may be mounted on the connection member 120 so that the connection pads 130P are connected to the connectors 125. Then, a reflow process may be performed. Then, optionally, the underfill resin 128 may be formed at the edge portion of the sensor chip 130 connected to the connectors 125. The underfill resin 128 may be formed by coating an insulating material having an adhesive property.

Figure 12C:
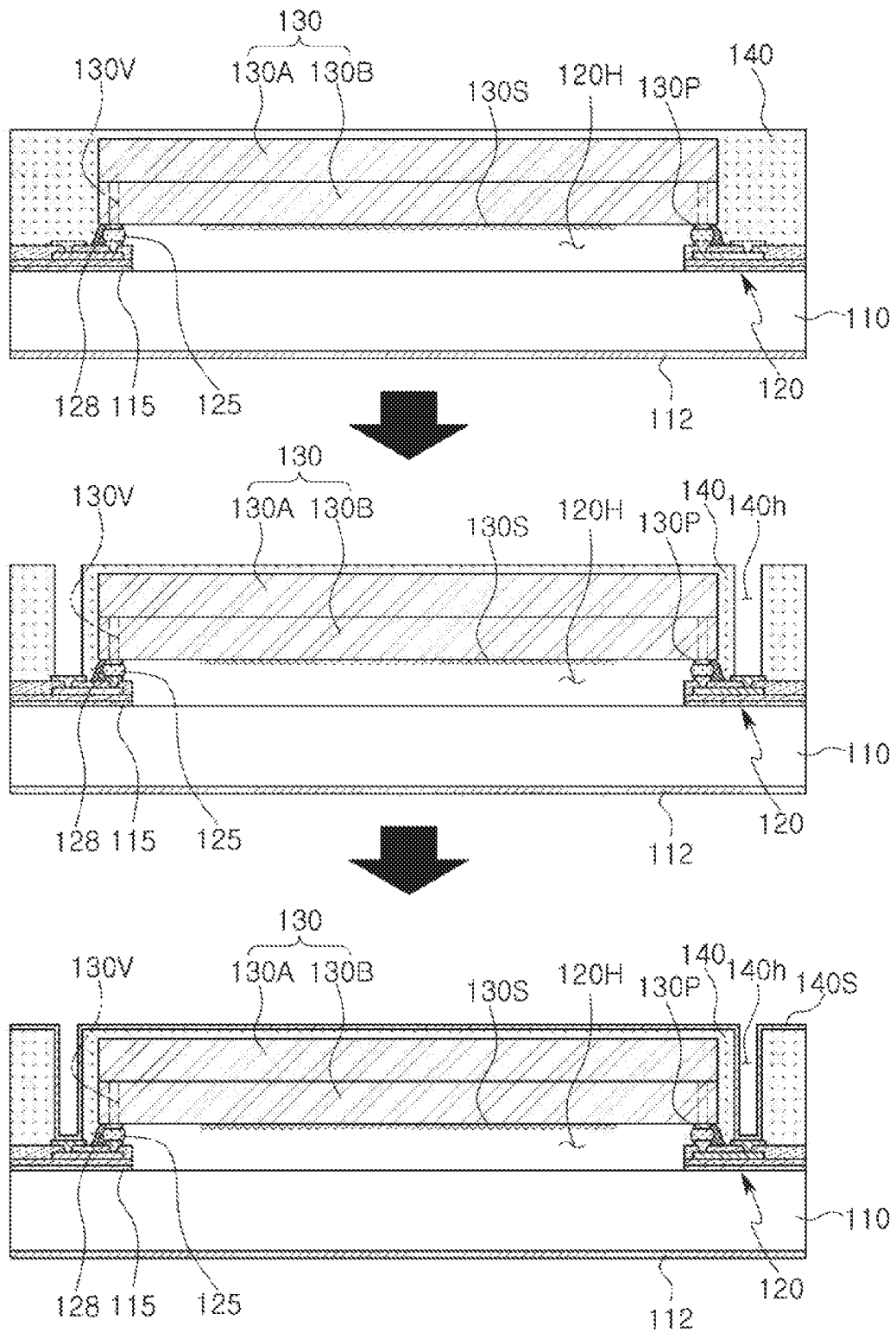

Then, referring to FIG. 12C, the sensor chip 130 may be encapsulated with the encapsulant 140. The encapsulant 140 may be formed by laminating ABF, or the like. Then, through-holes 140h penetrating through the encapsulant 140 to expose the pad patterns of the second redistribution layer 122b of the connection member 120 may be formed. The through-holes 140h may be formed using a mechanical drill, a laser drill, or the like. Then, a seed layer 140s may be formed on a surface of the encapsulant 140, walls of the through-holes 140h, and the pad patterns of the second redistribution layer 122b of the connection member 120 exposed by the through-holes 140h. The seed layer 140s may be formed by sputtering, chemical copper plating, or the like.

Figure 12D:
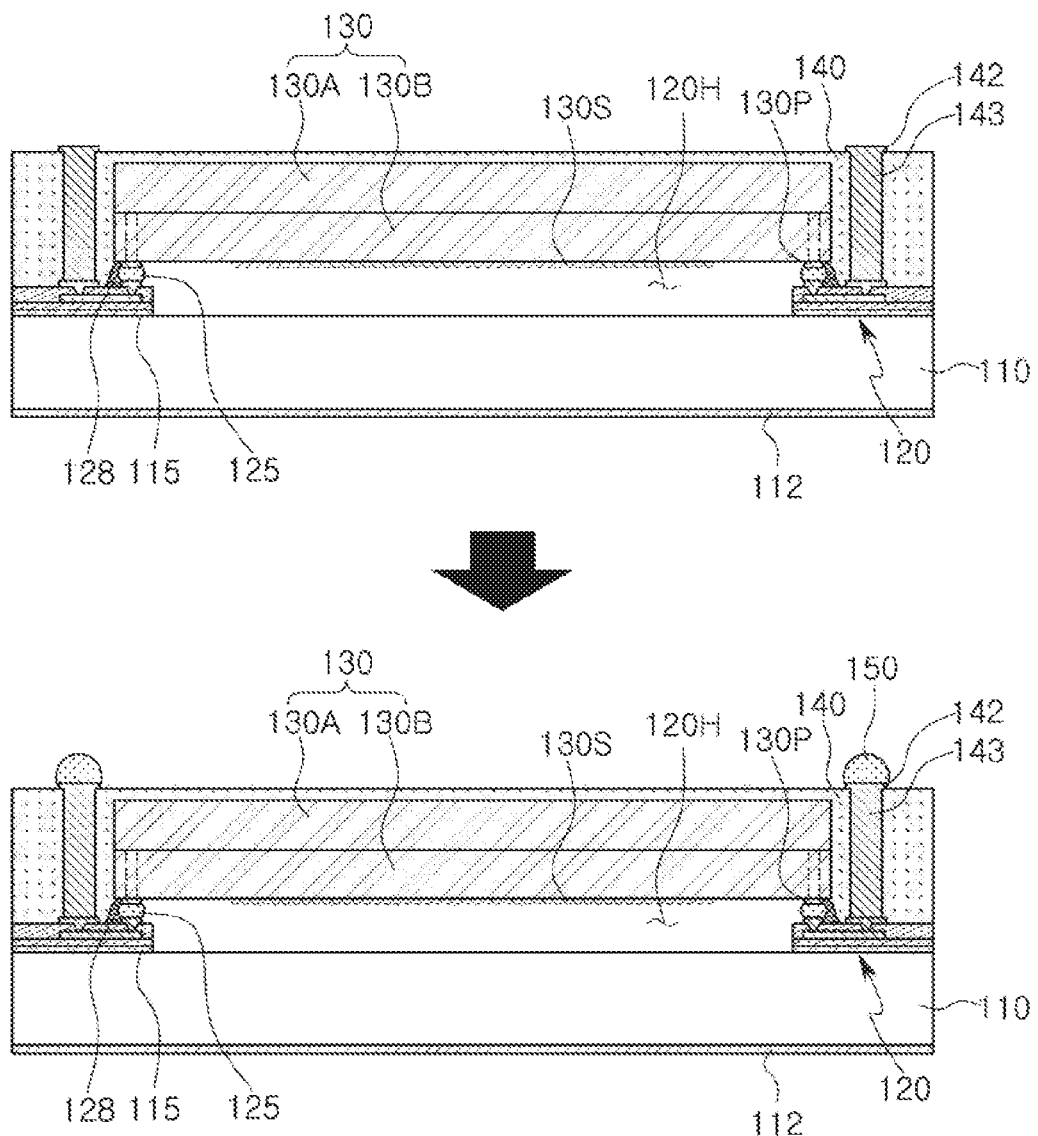

Then, referring to FIG. 12D, the through-wirings 143 and the pad layers 142 may be formed by a plating process using the seed layer 140s. Then, the electrical connection structures 150 may be formed on the encapsulant 140 to be connected to the pad layers 142. Then, a reflow process may be performed. A plurality of fan-out sensor packages 100A may be formed using the optical member 110 through a series of processes, and a large number of fan-out sensor packages 100A may be obtained by a subsequent dicing process.

Figure 13:
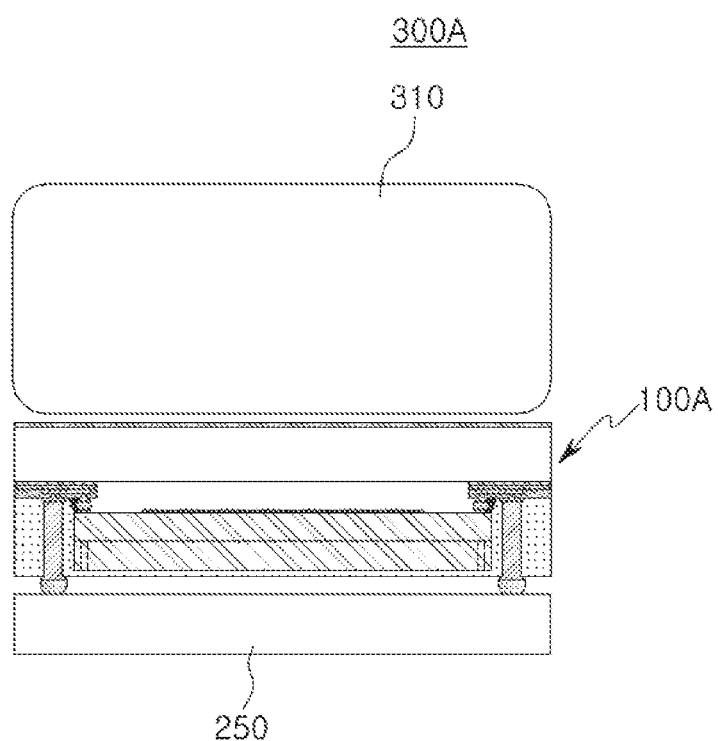
FIG. 13 is a schematic cross-sectional view illustrating an example of a camera module in which the fan-out sensor package of FIG. 9 is used.

FIG. 13 is a schematic cross-sectional view illustrating an example of a camera module in which the fan-out sensor package of FIG. 9 is used.

Referring to FIG. 13, a camera module 300A according to an exemplary embodiment in the present disclosure may include a circuit board 250, an image sensor package 100A disposed on the circuit board 250, and a lens member 310 disposed on the image sensor package 100A. The circuit board 250 may be any known printed circuit board (PCB) such as a mainboard used in an electrical camera module, or the like. The image sensor package 100A may be the fan-out sensor package 100A according to the exemplary embodiment described above. The lens member 310 may be any known component including a camera lens. For example, the lens member 310 may include a lens module, a housing accommodating the lens module therein, an actuator, a ball bearing portion, a case, a control unit, and the like. The lens module may include a lens barrel and a lens holder accommodating the lens barrel therein. The lens barrel may have a hollow cylindrical shape so that a plurality of lenses capturing an image of a subject may be accommodated therein, and the plurality of lenses may be provided in the lens barrel along an optical axis. The plurality of lenses may be stacked by a required number depending on a design of the lens module, and have optical characteristics such as refractive indices that are the same as or different from each other, or the like. The lens barrel may be coupled to the lens holder. For example, the lens barrel may be inserted into a hollow included in the lens holder, and the lens barrel and the lens holder may be coupled to each other in a screwing manner or be coupled to each other by an adhesive.

Figure 14:
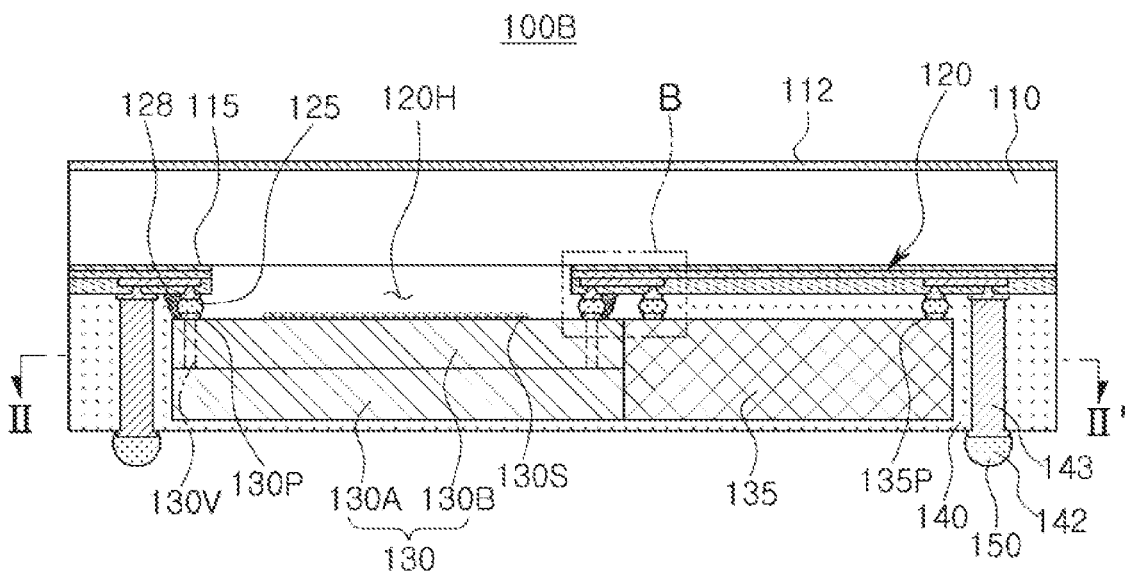
FIG. 14 is a schematic cross-sectional view illustrating another example of a fan-out sensor package.

FIG. 14 is a schematic cross-sectional view illustrating another example of a fan-out sensor package.

Figure 15:
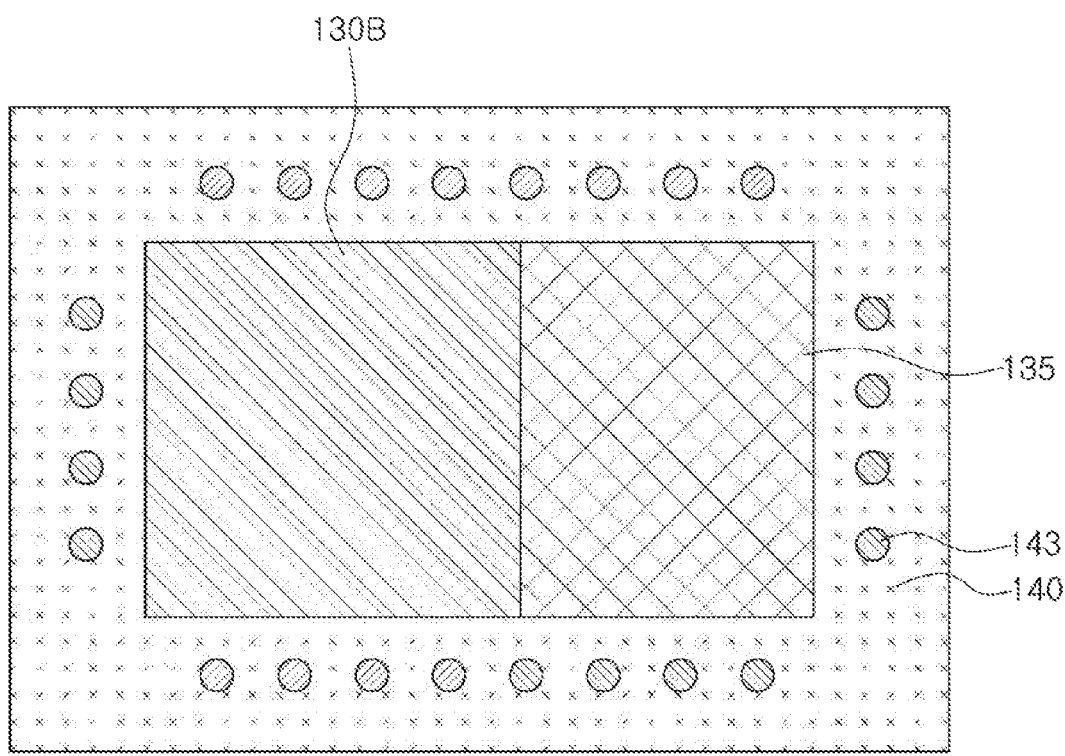
FIG. 15 is a schematic plan view taken along line II-II' of the fan-out sensor package of FIG. 14.

FIG. 15 is a schematic plan view taken along line II-II' of the fan-out sensor package of FIG. 14.

Figure 16:
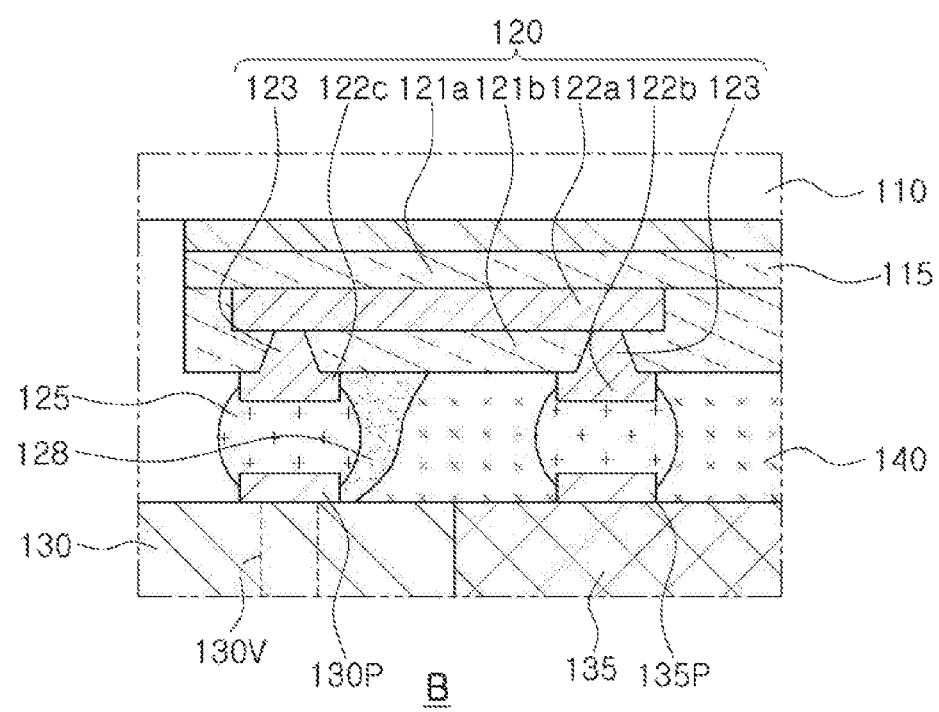
FIG. 16 is a schematic enlarged cross-sectional view illustrating region B of the fan-out sensor package of FIG. 14.
Figure 17A:
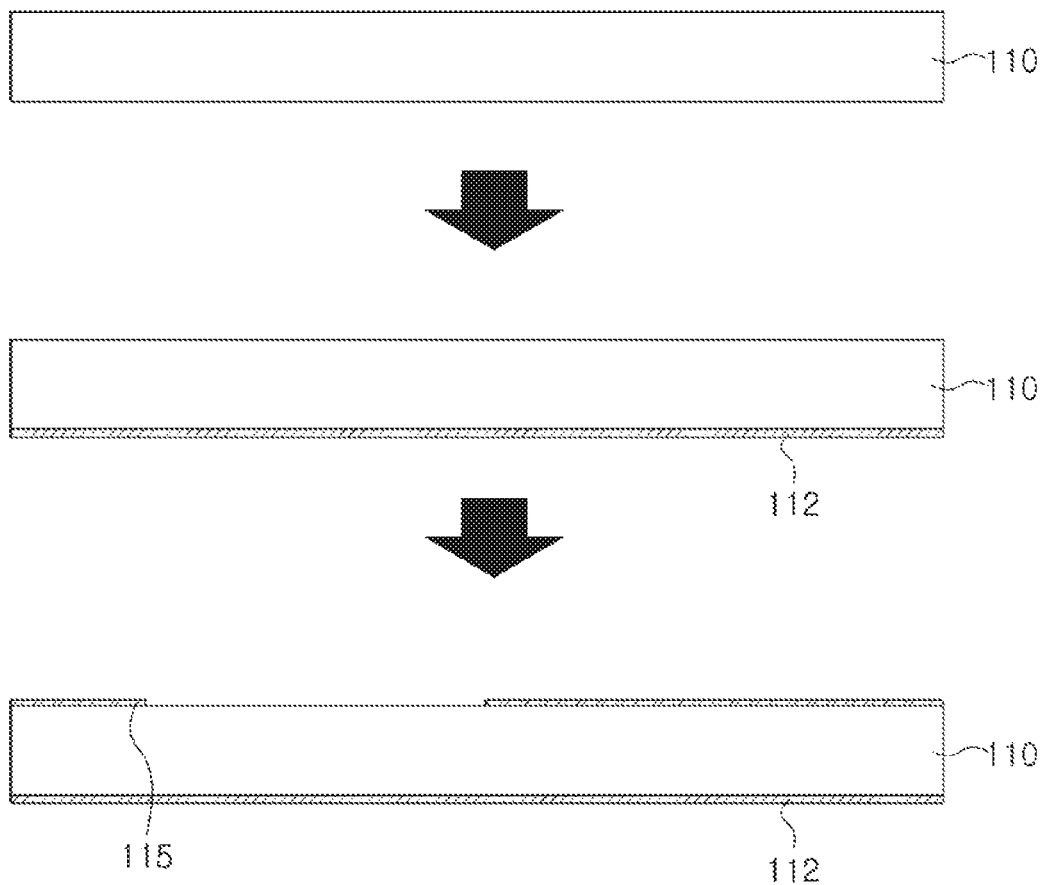
FIGS. 17A through 17D are schematic views illustrating an example of processes of manufacturing the fan-out sensor package of FIG. 14.
Figure 17B:
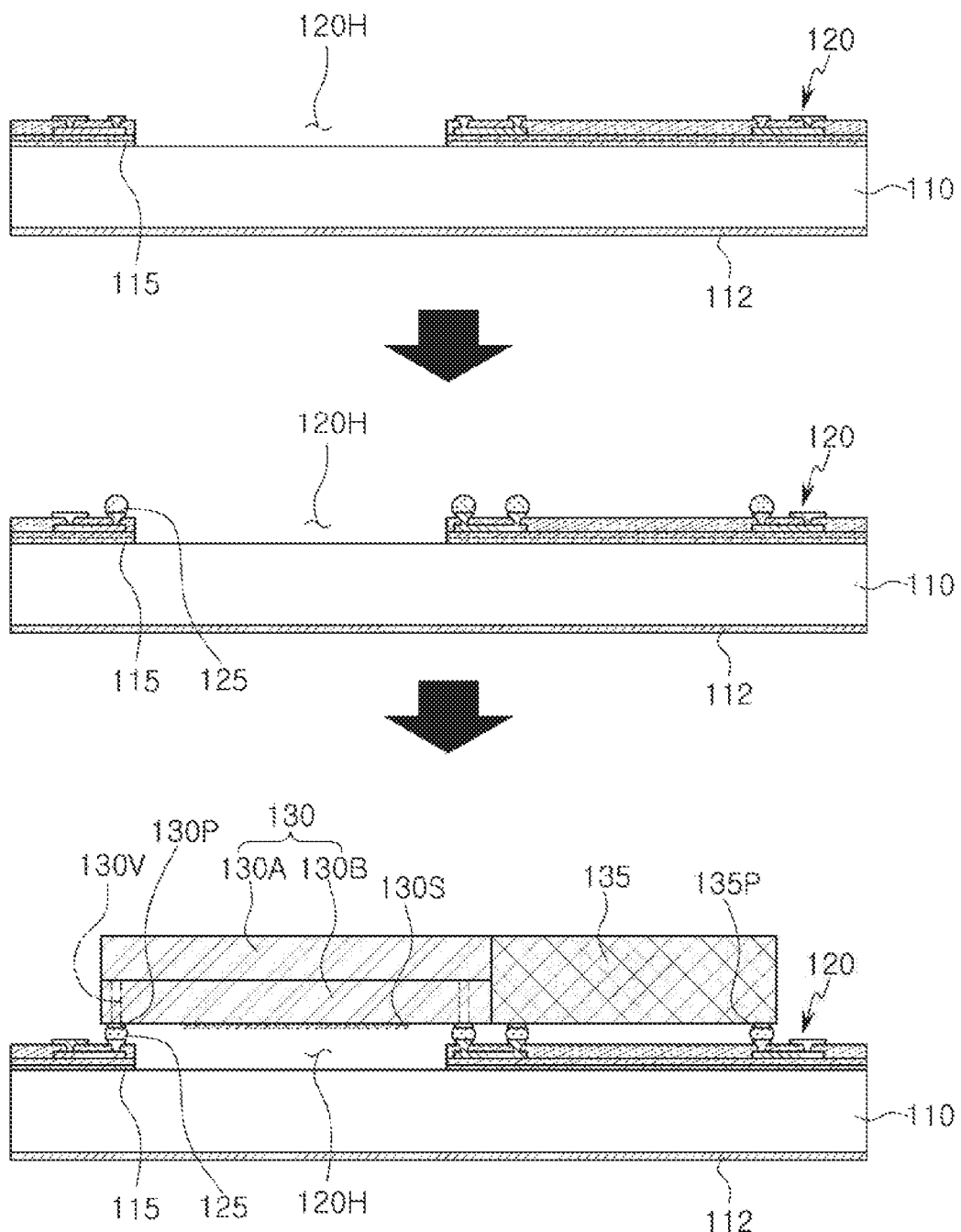
Figure 17C:
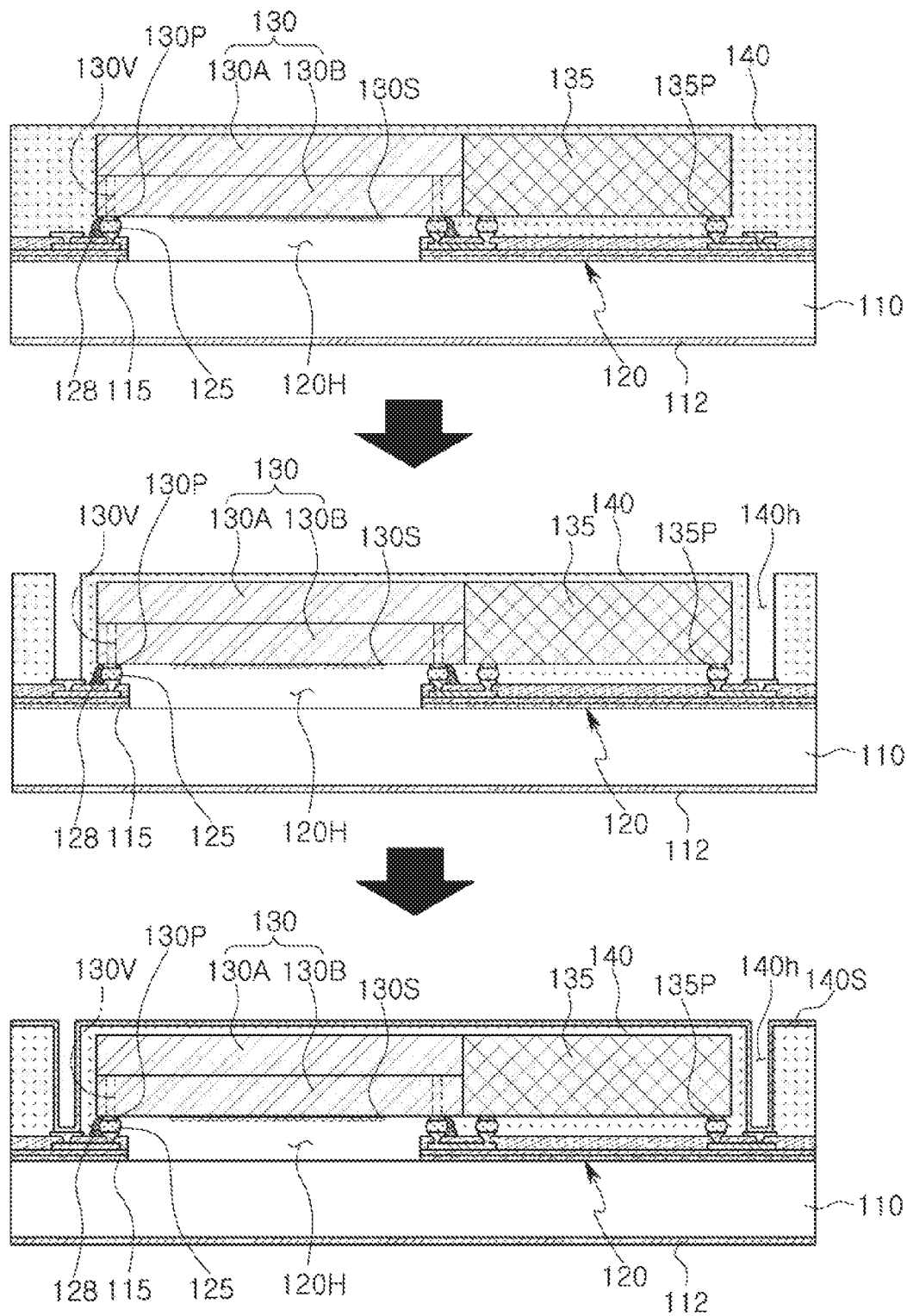
Figure 17D:
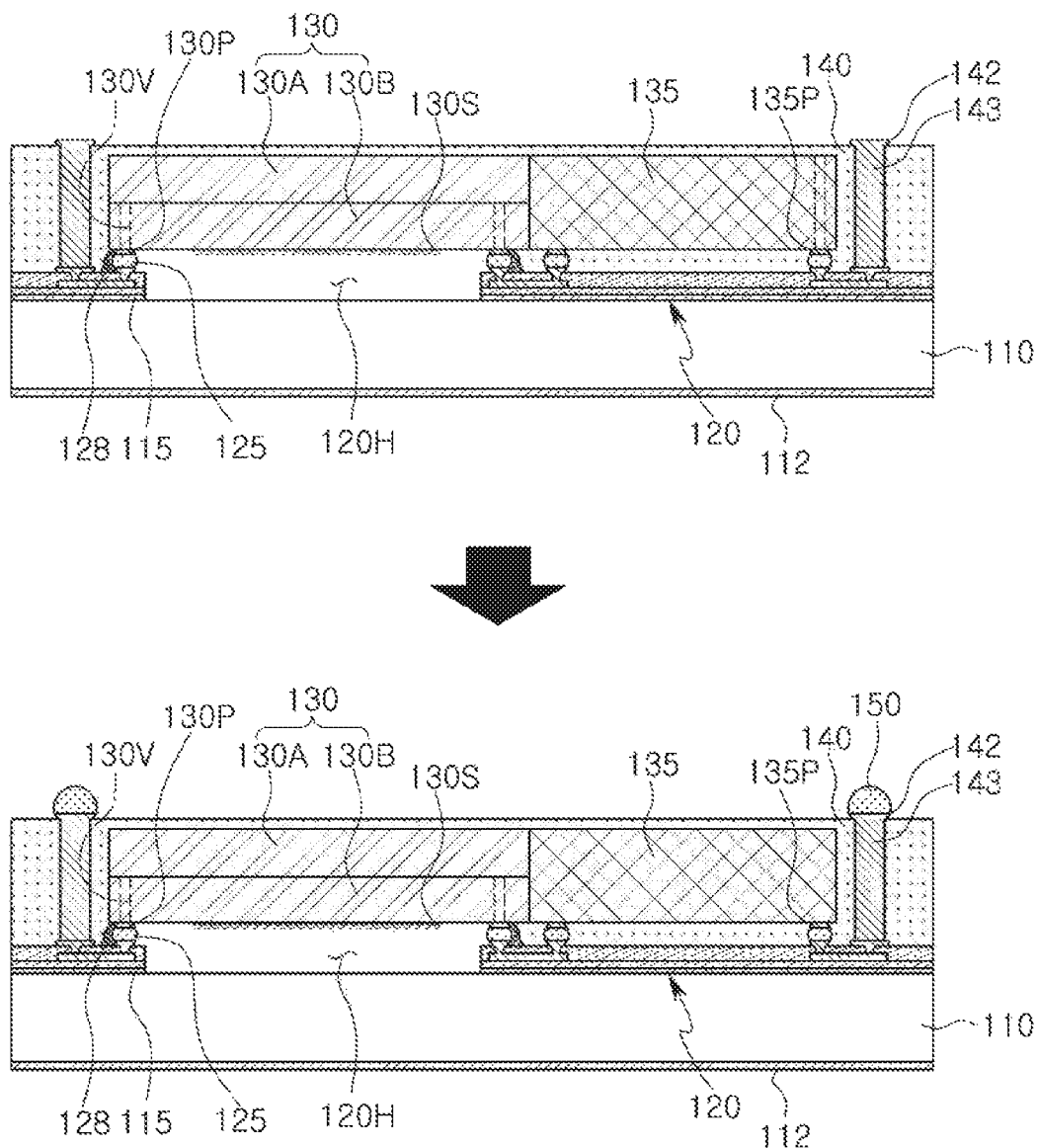

FIG. 16 is a schematic enlarged cross-sectional view illustrating region B of the fan-out sensor package of FIG. 14.

Referring to FIGS. 14 through 16, a fan-out sensor package 100B according to another exemplary embodiment in the present disclosure may further include a memory chip 135 disposed side-by-side with a sensor chip 130 and having a first surface having connection pads 135P disposed thereon and a second surface opposing the first surface. An encapsulant 140 may encapsulate at least portions of the memory chip 135. For example, the encapsulant 140 may cover the first and second surfaces of the memory chip 135 and at least portions of each of side surfaces of the memory chip 135 between the first and second surfaces of the memory chip 135. A connection member 120 may also be disposed on the first surface of the memory chip 135, and redistribution layers 122a and 122b may also be electrically connected to the connection pads 135P of the memory chip 135. The memory chip 135 and the connection member 120 may also be physically spaced apart from each other by a predetermined distance, and connectors 125 may also be disposed between the memory chip 135 and the connection member 120 and may electrically connect the redistribution layers 122a and 122b and the connection pads 135P of the memory chip 135 to each other. Connection pads 130P of the sensor chip 130 and the connection pads 135P of the memory chip 135 may be electrically connected to each other through the redistribution layers 122a and 122b. The connection pads 135P of the memory chip 135 may also be electrically connected to through-wirings 143 through the redistribution layers 122a and 122b. Resultantly, the connection pads 135P may also be electrically connected to electrical connection structures 150. One side surface of the sensor chip 130 and one side surface of the memory chip 135 may be in physical contact with each other. However, the sensor chip 130 and the memory chip 135 are not limited thereto, but may also be disposed to be spaced apart from each other by a predetermined distance, if necessary. The memory chip 135 may be any known memory chip such as a volatile memory (for example, a DRAM), a non-volatile memory (for example, a ROM), a flash memory, or the like, and may have a form in which a plurality of memories are stacked, if necessary.

Meanwhile, a typical example of main components included in smartphones may include a camera module. In general, the camera module included in the smartphone has a structure in which an image sensor is attached to a rigid-flexible printed circuit board (RFPCB) in a wire bonding manner and a lens unit including an infrared cut filter controlling optical characteristics is disposed on the image sensor. Recently, in accordance with an increase in an image processing speed due to the use of a high level of resolution, ultra-high speed image capturing, and the like, it is demanded to dispose a separate large capacity memory in the vicinity of the image sensor. Therefore, a method of attaching a separate memory chip to a lower portion of the image sensor is considered. However, in such a structure, through-silicon vias (TSVs) need to be formed to penetrate up to a logic of the image sensor in order to connect the logic and the memory to each other, and the separate memory chip needs to be attached to the lower portion of the image sensor. Therefore, due to the addition of these processes, a cost may be increased, and a yield may be decreased. In addition, a thickness of the camera module, which is considered to be most important in the camera module, is increased, and it is thus difficult to use the camera module in an electronic device such as the smartphone.

On the other hand, in the fan-out sensor package 100B according to another exemplary embodiment, the sensor chip 130 and the memory chip 135 are disposed adjacent to each other and are electrically connected to each other through the connectors 125 and the connection member 120, and high-speed communications between the sensor chip 130 and the memory chip 135 may thus be possible through integration between the sensor chip 130 and the memory chip 135 without increasing a thickness. In addition, a separate infrared cut filter used in a lens unit may be omitted by optionally forming an infrared blocking coating layer 112 on one surface of an optical member 110. In addition, also in the fan-out sensor package 100B according to another exemplary embodiment, the connection pads 130P and 135P of the sensor chip 130 and the memory chip 135 may be redistributed using the connection member 120 rather than wire bonding, and the fan-out sensor package 100B may be miniaturized, performance of the fan-out sensor package 100B may be improved, and a module may be more easily manufactured. In addition, since the sensor chip 130 and the memory chip 135 are surface-mounted on the connection member 120 manufactured in advance, using the connectors 125, reliability of the fan-out sensor package 100B may be excellent, and a phenomenon in which yields of the sensor chip 130 and the memory chip 135 are affected by a defect occurring before the sensor chip 130 and the memory chip 135 are disposed may be prevented. In addition, since an electrical connection path between upper and lower portions is implemented using the through-wirings 143 penetrating through the encapsulant 140, the fan-out sensor package 100B may also be thinned. In addition, a structure closing a light receiving unit of the sensor chip 130 may be implemented using the optical member 110 as a cover layer without separating the optical member 110, and when a glass carrier is used as the optical member 110, material and process costs may also be decreased. Other contents overlap those described above, and a detailed description thereof is thus omitted.

FIGS. 17A through 17D are schematic views illustrating an example of processes of manufacturing the fan-out sensor package of FIG. 14.

Referring to FIGS. 17A through 17D, the optical member 110 may be first prepared. Then, optionally, the infrared blocking coating layer 112 and the barrier layer 115 may be formed on the first and second surfaces of the optical member 110, respectively. Then, the connection member 120 may be formed on the barrier layer 115 of the optical member 110. Then, the connectors 125 may be formed on pad patterns of the second redistribution layer 122b of the connection member 120 using a solder material, or the like. Then, the sensor chip 130 and the memory chip 135 may be mounted on the connection member 120 so that the connection pads 130P and 135P are connected to the connectors 125. Then, a reflow process may be performed. Then, optionally, the underfill resin 128 may be formed at the edge portion of the sensor chip 130 connected to the connectors 125. Then, the sensor chip 130 and the memory chip 135 may be encapsulated with the encapsulant 140. Then, through-holes 140*h* penetrating through the encapsulant 140 to expose the pad patterns of the second redistribution layer 122*b* of the connection member 120 may be formed. Then, a seed layer 140S may be formed on a surface of the encapsulant 140, walls of the through-holes 140*h*, and the pad patterns of the second redistribution layer 122*b* of the connection member 120 exposed by the through-holes 140*h*. Then, the through-wirings 143 and the pad layers 142 may be formed by a plating process using the seed layer 140*s*. Then, the electrical connection structures 150 may be formed on the encapsulant 140 to be connected to the pad layers 142. Then, a reflow process may be performed. A plurality of fan-out sensor packages 100B may be formed using the optical member 110 through a series of processes, and a large number of fan-out sensor packages 100B may be obtained by a subsequent dicing process. Other contents overlap those described above, and a detailed description thereof is thus omitted.

Figure 18:
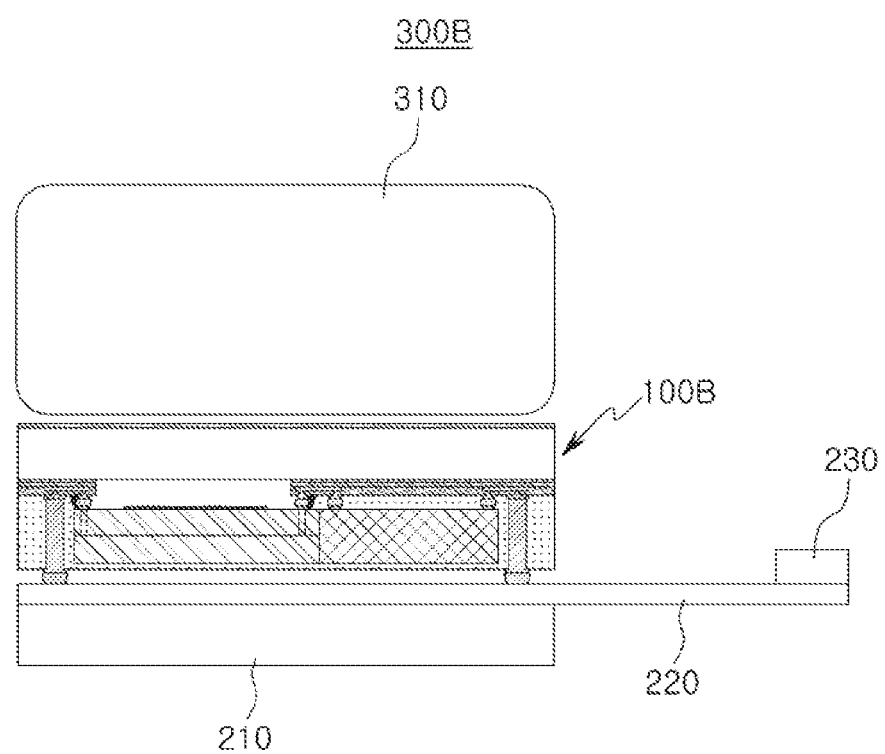
FIG. 18 is a schematic cross-sectional view illustrating an example of a camera module in which the fan-out sensor package of FIG. 14 is used.

FIG. 18 is a schematic cross-sectional view illustrating an example of a camera module in which the fan-out sensor package of FIG. 14 is used.

Referring to FIG. 18, a camera module 300B according to another exemplary embodiment in the present disclosure may include a support substrate 210, a circuit board 220 disposed on the support substrate 210, an image sensor package 100B disposed on the circuit board 220, an electronic component 230 disposed on the circuit board 220, and a lens member 310 disposed on the image sensor package 100B. The support substrate 210 may be attached to a lower portion of the circuit board 220 through an adhesive. The support substrate 210 may support other components of the camera module 300A. The support substrate 210 may prevent the circuit board 220 from being warped depending on its material. The support substrate 210 may be formed of a stainless material. However, the support member 210 is not limited thereto, but may also be formed of an insulating material. The support substrate 210 may also be omitted. The circuit board 220 may be a rigid printed circuit board (RPCB), a flexible printed circuit board (FPCB), or a rigid-flexible printed circuit boar (RFPCB) in which an RPCB and an FPCB are combined with each other. The image sensor package 100B may be the fan-out sensor package 100B according to another exemplary embodiment described above. The lens member 310 may be any known component including a camera lens, as described above. Other contents overlap those described above, and a detailed description thereof is thus omitted.

As set forth above, according to the exemplary embodiments in the present disclosure, a fan-out sensor package of which miniaturization, performance improvement, simplification of processes, and reliability improvement are possible may be provided.

While exemplary embodiments have been shown and described above, it will be apparent to those skilled in the art that modifications and variations could be made without departing from the scope of the present invention as defined by the appended claims.

What is claimed is:

1. A fan-out sensor package comprising:
a sensor chip having a first surface and a second surface opposing the first surface, connection pads and an optical layer being disposed on the first surface;
an encapsulant encapsulating portions of the sensor chip;
a connection member disposed on the first surface and the encapsulant and including a redistribution layer and a via electrically connected to the connection pads; through-wirings penetrating through the encapsulant and electrically connected to the redistribution layer; and
electrical connection structures disposed on the other surface of the encapsulant opposing one surface of the encapsulant on which the connection member is disposed and electrically connected to the through-wirings,
wherein the sensor chip and the connection member are physically spaced apart from each other,
the connection pads and the redistribution layer are electrically connected to each other through connectors disposed between the sensor chip and the connection member,
the connection member further includes an insulating layer on which the redistribution layer is disposed,
the redistribution layer is disposed between the via and the connectors, and
the via extends from the redistribution layer into the insulating layer and is tapered so as to have a decreased width in a direction from the electrical connection structures to the connection member.

2. The fan-out sensor package of claim 1, wherein the sensor chip includes a logic die and a sensor die disposed on the logic die,
the sensor die has a first surface and the logic die has a second surface, and
a third surface of the sensor die opposing the first surface of the sensor die and a fourth surface of the logic die opposing the second surface of the logic die are in direct contact with each other.

3. The fan-out sensor package of claim 2, wherein the connectors include a low melting point metal having a melting point lower than that of each metal included in the connection pads and the redistribution layer.

4. The fan-out sensor package of claim 3, wherein the low melting point metal includes tin (Sn).

5. The fan-out sensor package of claim 2, wherein the sensor die is a complementary metal oxide semiconductor (CMOS) image sensor (CIS) type sensor die.

6. The fan-out sensor package of claim 2, wherein the logic die and the sensor die are electrically connected to each other through a through-silicon via (TSV).

7. The fan-out sensor package of claim 1, wherein each of the connectors includes a solder ball.

8. The fan-out sensor package of claim 1, further comprising an optical member disposed on a second surface of the connection member opposing a first surface of the connection member on which the encapsulant and the sensor chip are disposed.

9. The fan-out sensor package of claim 8, wherein the optical member is a glass carrier.

10. The fan-out sensor package of claim 8, further comprising an infrared blocking layer disposed on a first surface of the optical member.

11. The fan-out sensor package of claim 10, further comprising a barrier layer disposed on a second surface of the optical member opposing the first surface of the optical member,
wherein the barrier layer is disposed between the optical member and the connection member.

12. The fan-out sensor package of claim 1, wherein the encapsulant does not cover the optical layer of the sensor chip, and
the connection member has an opening exposing the optical layer.

13. The fan-out sensor package of claim 1, further comprising an underfill resin covering at least a portion of the connectors.

14. The fan-out sensor package of claim 1,
wherein the sensor chip includes a logic die and a sensor die disposed on the logic die,
the sensor die has a first surface and the logic die has a second surface,
a third surface of the sensor die opposing the first surface of the sensor die and a fourth surface of the logic die opposing the second surface of the logic die are in direct contact with each other,
the connection member further includes an optically transparent carrier, and
the optically transparent carrier is physically spaced apart from the optical layer.

15. The fan-out semiconductor package of claim 14, wherein the connection member further comprises a barrier layer disposed between the optically transparent carrier and the redistribution layer.

16. The fan-out semiconductor package of claim 14, further comprising an underfill resin covering at least a portion of the first connectors.

17. The fan-out sensor package of claim 1, further comprising a semiconductor chip disposed adjacent to the sensor chip such that a side wall of the semiconductor chip and a side wall of the sensor chip are physically in contact.

18. The fan-out sensor package of claim 17, wherein the semiconductor chip is a memory chip.

19. A fan-out sensor package comprising:
a sensor chip including a logic die and a sensor die disposed on the logic die, the sensor die having a first surface and the logic die having a second surface, a third surface of the sensor die opposing the first surface and a fourth surface of the logic die opposing the second surface being in direct contact with each other, the sensor chip including first connection pads and an optical layer disposed on the first surface;
an encapsulant encapsulating portions of the sensor chip;
a connection member disposed on the first surface and the encapsulant and including a redistribution layer electrically connected to the first connection pads;
through-wirings penetrating through the encapsulant and electrically connected to the redistribution layer; and
electrical connection structures disposed on the other surface of the encapsulant opposing one surface of the encapsulant on which the connection member is disposed and electrically connected to the through-wirings,
wherein the sensor chip and the connection member are physically spaced apart from each other,
the first connection pads and the redistribution layer are electrically connected to each other through first connectors disposed between the sensor chip and the connection member,
the fan-out sensor package further comprises a memory chip disposed adjacent to the sensor chip and having a first surface having second connection pads disposed thereon and a second surface opposing the first surface of the memory chip,
the encapsulant encapsulates at least portions of the memory chip,
the connection member is disposed on the first surface of the memory chip,
the redistribution layer is electrically connected to the second connection pads,
the memory chip and the connection member are physically spaced apart from each other,
the second connection pads and the redistribution layer are electrically connected to each other through second connectors disposed between the memory chip and the connection member, and
the first and second connection pads are electrically connected to each other through the redistribution layer.

20. The fan-out sensor package of claim 19, wherein a side surface of the sensor chip and a side surface of the memory chip are in physical contact with each other.

21. The fan-out sensor package of claim 19, wherein the second connectors include a low melting point metal having a melting point lower than that of each metal included in the second connection pads and the redistribution layer.

* * * * *